US011908513B2

(12) United States Patent
Tran et al.

(10) Patent No.: US 11,908,513 B2
(45) Date of Patent: Feb. 20, 2024

(54) NEURAL MEMORY ARRAY STORING SYNAPSIS WEIGHTS IN DIFFERENTIAL CELL PAIRS

(71) Applicant: Silicon Storage Technology, Inc., San Jose, CA (US)

(72) Inventors: Hieu Van Tran, San Jose, CA (US); Thuan Vu, San Jose, CA (US); Stephen Trinh, San Jose, CA (US); Stanley Hong, San Jose, CA (US); Anh Ly, San Jose, CA (US); Vipin Tiwari, Dublin, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 18/103,383

(22) Filed: Jan. 30, 2023

(65) Prior Publication Data

US 2023/0178147 A1 Jun. 8, 2023

Related U.S. Application Data

(62) Division of application No. 16/987,101, filed on Aug. 6, 2020, now Pat. No. 11,600,321.

(Continued)

(51) Int. Cl.
*G11C 11/54* (2006.01)
*G11C 16/04* (2006.01)
(Continued)

(52) U.S. Cl.
CPC .............. *G11C 11/54* (2013.01); *G06N 3/063* (2013.01); *G06N 3/065* (2023.01);
(Continued)

(58) Field of Classification Search
CPC . G11C 11/54; G11C 16/0416; G11C 16/0425; G11C 16/28
See application file for complete search history.

(56) References Cited

U.S. PATENT DOCUMENTS 5,022,009 A 6/1991 Terada
5,029,130 A 7/1991 Yeh
(Continued)

FOREIGN PATENT DOCUMENTS

JP 2020-009112 1/2020
WO 2017/044251 3/2017
(Continued)

OTHER PUBLICATIONS

European Examination Report dated Aug. 2, 2023 corresponding to the related European Patent Application No. 20780397.4.
(Continued)

*Primary Examiner* — Han Yang
(74) *Attorney, Agent, or Firm* — DLA PIPER LLP US

(57) ABSTRACT

Numerous embodiments of analog neural memory arrays are disclosed. In one embodiment, a system comprises a first array of non-volatile memory cells, wherein the cells are arranged in rows and columns and the non-volatile memory cells in one or more of the columns stores W+ values, and wherein one of the columns in the first array is a dummy column; and a second array of non-volatile memory cells, wherein the cells are arranged in rows and columns and the non-volatile memory cells in one or more of the columns stores W− values, and wherein one of the columns in the second array is a dummy column; wherein pairs of cells from the first array and the second array store a differential weight, W, according to the formula W=(W+)−(W−).

16 Claims, 33 Drawing Sheets

Related U.S. Application Data

(60) Provisional application No. 62/985,826, filed on Mar. 5, 2020.

(51) Int. Cl.

| | | |
|---|---|---|
| *G06N 3/063* | (2023.01) | |
| *G11C 16/26* | (2006.01) | |
| *G11C 16/28* | (2006.01) | |
| *H03F 3/00* | (2006.01) | |
| *H03M 1/16* | (2006.01) | |
| *G06N 3/065* | (2023.01) | |
| *H03M 1/38* | (2006.01) | |

(52) U.S. Cl.
CPC ...... *G11C 16/0416* (2013.01); *G11C 16/0425* (2013.01); *G11C 16/26* (2013.01); *G11C 16/28* (2013.01); *H03F 3/005* (2013.01); *H03M 1/164* (2013.01); *H03M 1/38* (2013.01)

(56) References Cited

U.S. PATENT DOCUMENTS

| | | | |
|---|---|---|---|
| 5,256,911 | A | 10/1993 | Holler |
| 6,747,310 | B2 | 6/2004 | Fan |
| 9,875,780 | B1 | 1/2018 | Debrosse |
| 10,242,737 | B1 | 3/2019 | Lin |
| 10,909,445 | B2 | 2/2021 | Leobandung |
| 10,957,392 | B2 * | 3/2021 | Lee .......... G11C 16/26 |
| 11,507,642 | B2 | 11/2022 | Tran |
| 2009/0091981 | A1 | 4/2009 | Park et al. |
| 2017/0337466 | A1 | 11/2017 | Bayat |
| 2019/0205729 | A1 | 7/2019 | Tran |
| 2019/0213234 | A1 | 7/2019 | Bayat |
| 2019/0220249 | A1 | 7/2019 | Lee |
| 2019/0392316 | A1 | 12/2019 | Kim |
| 2020/0019849 | A1 | 1/2020 | Tran |
| 2020/0065650 | A1 | 2/2020 | Tran |
| 2020/0301667 | A1 | 9/2020 | Hung |

FOREIGN PATENT DOCUMENTS

| | | |
|---|---|---|
| WO | 2017 200888 | 11/2017 |
| WO | 2020 040893 | 2/2020 |

OTHER PUBLICATIONS

U.S. Appl. No. 62/981,757 entitled "Ultra-Precise Tuning Of Analog Neural Memory Cells In A Deep Learning Artificial Neural Network," filed Feb. 26, 2020, Lemke, et al.

PCT Search Report dated Dec. 23, 2020 corresponding to the related PCT Patent Application No. US2020/049294.

Japanese Office Action dated Oct. 3, 2023 corresponding to the Japanese Patent Application No. 2022-552598.

* cited by examiner

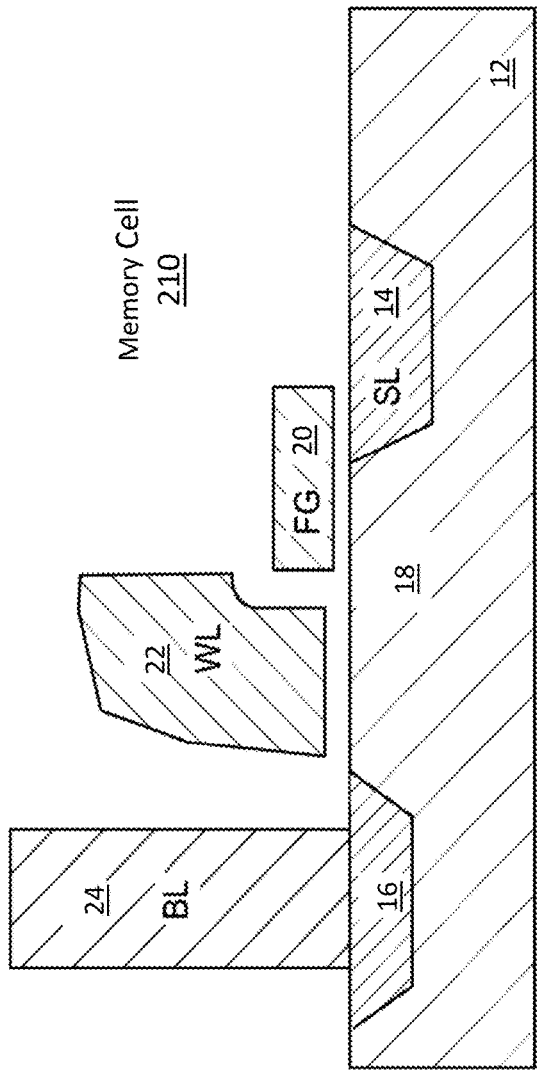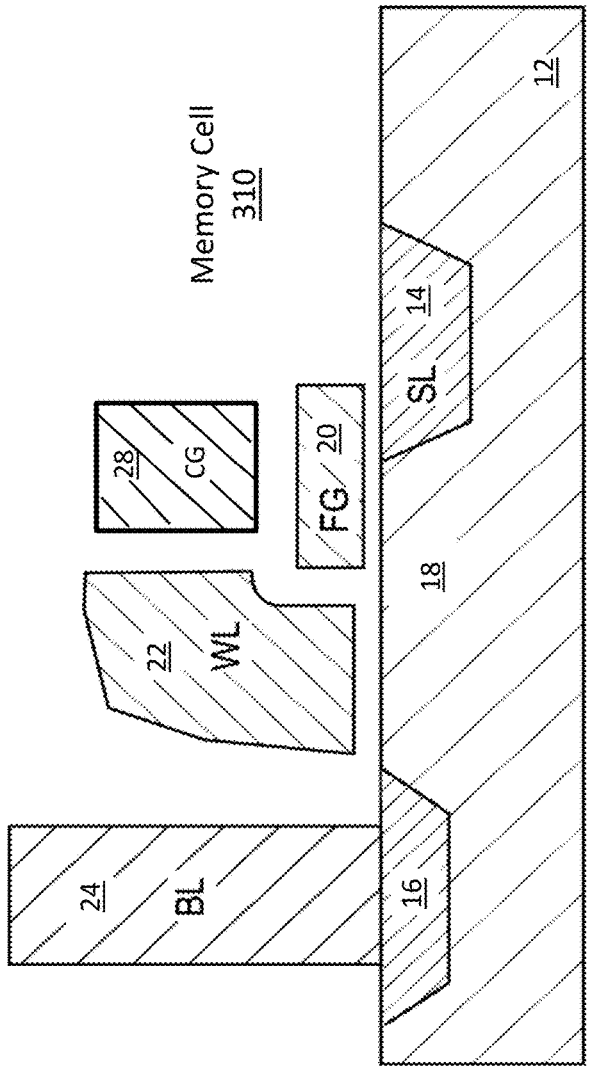
FIGURE 2
(PRIOR ART)
FIGURE 3
(PRIOR ART)

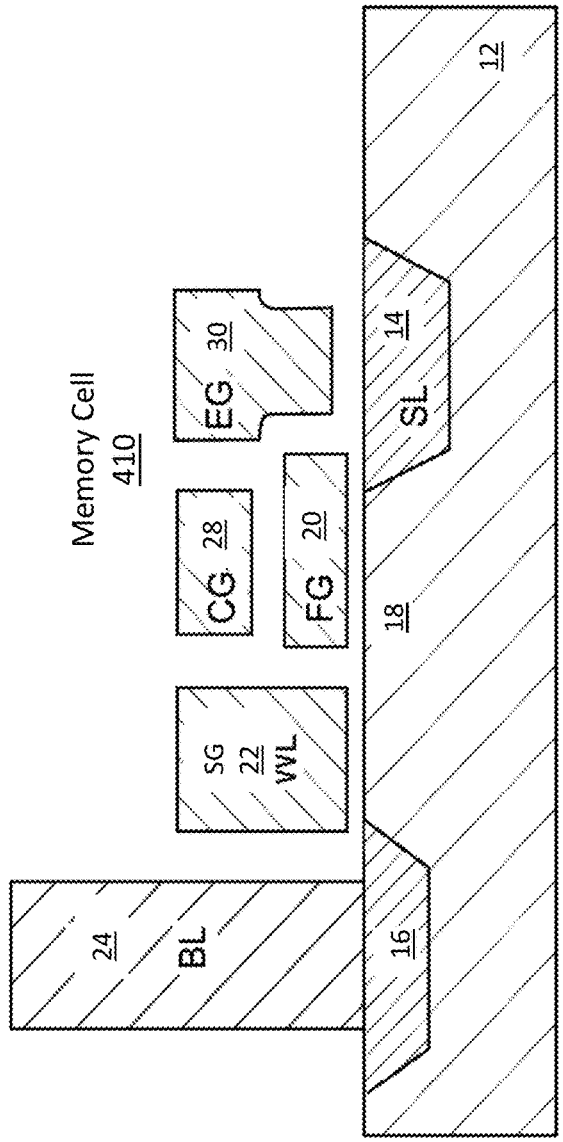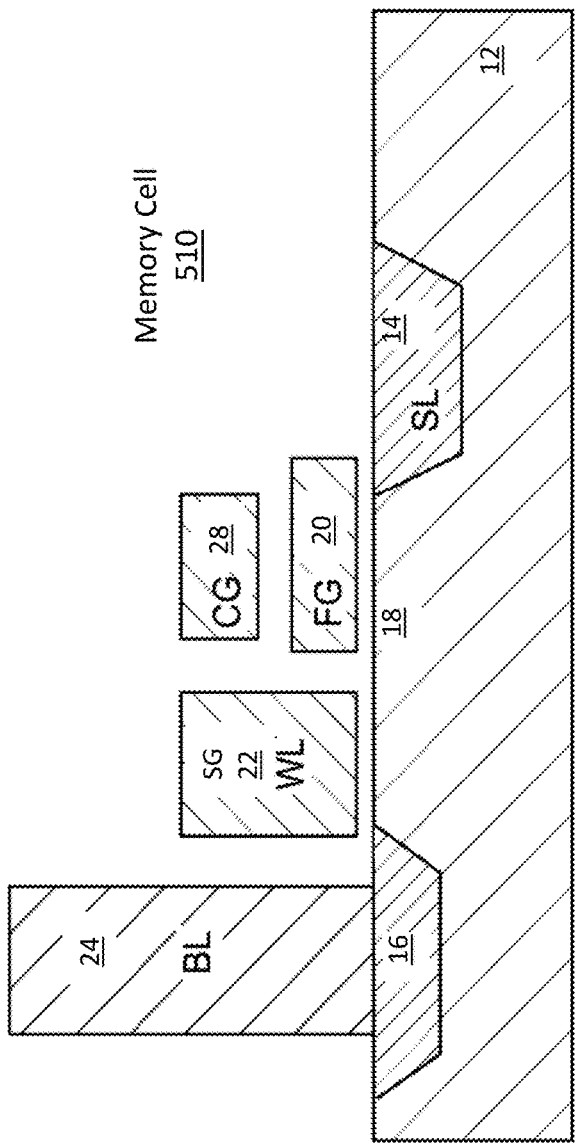
FIGURE 4
(PRIOR ART)
FIGURE 5
(PRIOR ART)

VMM System 2110 w+ array 2111

2113 w- array 2112

Pipelined SAR ADC Circuit 3300

NEURAL MEMORY ARRAY STORING SYNAPSIS WEIGHTS IN DIFFERENTIAL CELL PAIRS

PRIORITY CLAIM

This application is a divisional application of U.S. patent application Ser. No. 16/987,101, filed on Aug. 6, 2020, and titled "Analog Neural Memory Array Storing Synapsis Weights in Differential Cell Pairs in Artificial Neural Network," which claims priority to U.S. Provisional Application No. 62/985,826, filed on Mar. 5, 2020, and titled, "Analog Neural Memory Array in Artificial Neural Network With Accurate Array Source Impedance With Adaptive Weight Mapping and Distributed Power," which are incorporated by reference herein.

FIELD OF THE INVENTION

Numerous embodiments of analog neural memory arrays are disclosed. In certain embodiments, synapsis weights are stored in differential cell pairs in an array.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network 100, where the circles represent the inputs or layers of neurons. The connections (called synapses) are represented by arrows, and have numeric weights that can be tuned based on experience. This makes the artificial neural network adaptive to inputs and capable of learning. Typically, artificial neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical artificial neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, published as US Patent Publication 2017/0337466, which is incorporated by reference. The non-volatile memory arrays operate as an analog neuromorphic memory. The term neuromorphic, as used herein, means circuitry that implement models of neural systems. The analog neuromorphic memory includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs. An array of memory cells arranged in this manner can be referred to as a vector by matrix multiplication (VMM) array.

Examples of different non-volatile memory cells that can be used in VMMs will now be discussed.

Non-Volatile Memory Cells

Various types of known non-volatile memory cells can be used in the VMM arrays. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline terminal 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the drain region 16 towards the source region 14 (source line terminal). The electrons will accelerate and become energized (heated) when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

Operation of Flash Memory Cell 210 of FIG. 2

|  | WL | BL | SL |
|---|---|---|---|
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 μA | 9-10 V |

"Read 1" is a read mode in which the cell current is output on the bit line. "Read 2" is a read mode in which the cell current is output on the source line terminal.

FIG. 3 shows memory cell 310, which is similar to memory cell 210 of FIG. 2 with the addition of control gate (CG) terminal 28. Control gate terminal 28 is biased at a high voltage, e.g., 10V, in programming, low or negative in erase, e.g., 0 v/−8V, low or mid range in read, e.g., 0 v/2.5V. Other terminals are biased similarly to that of FIG. 2.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 410 for performing read, erase, and program operations:

TABLE NO. 2

Operation of Flash Memory Cell 410 of FIG. 4

|  | WL/SG | BL | CG | EG | SL |
|---|---|---|---|---|---|
| Read 1 | 0.5-2 V | 0.1-2 V | 0-2.6 V | 0-2.6 V | 0 V |
| Read 2 | 0.5-2 V | 0-2 V | 0-2.6 V | 0-2.6 V | 2-0.1 V |
| Erase | −0.5 V/0 V | 0 V | 0 V/−8 V | 8-12 V | 0 V |
| Program | 1 V | 1 μA | 8-11 V | 4.5-9 V | 4.5-5 V |

"Read 1" is a read mode in which the cell current is output on the bit line. "Read 2" is a read mode in which the cell current is output on the source line terminal.

FIG. 5 shows memory cell 510, which is similar to memory cell 410 of FIG. 4 except that memory cell 510 does not contain an erase gate EG terminal. An erase is performed by biasing the substrate 18 to a high voltage and biasing the control gate CG terminal 28 to a low or negative voltage. Alternatively, an erase is performed by biasing word line terminal 22 to a positive voltage and biasing control gate terminal 28 to a negative voltage. Programming and reading is similar to that of FIG. 4.

FIG. 6 depicts a three-gate memory cell 610, which is another type of flash memory cell. Memory cell 610 is identical to the memory cell 410 of FIG. 4 except that memory cell 610 does not have a separate control gate terminal. The erase operation (whereby erasing occurs through use of the erase gate terminal) and read operation are similar to that of the FIG. 4 except there is no control gate bias applied. The programming operation also is done without the control gate bias, and as a result, a higher voltage must be applied on the source line terminal during a program operation to compensate for a lack of control gate bias.

Table No. 3 depicts typical voltage ranges that can be applied to the terminals of memory cell 610 for performing read, erase, and program operations:

TABLE NO. 3

Operation of Flash Memory Cell 610 of FIG. 6

|  | WL/SG | BL | EG | SL |
|---|---|---|---|---|
| Read 1 | 0.5-2.2 V | 0.1-2 V | 0-2.6 V | 0 V |
| Read 2 | 0.5-2.2 V | 0-2 V | 0-2.6 V | 2-0.1 V |
| Erase | −0.5 V/0 V | 0 V | 11.5 V | 0 V |
| Program | 1 V | 2-3 μA | 4.5 V | 7-9 V |

"Read 1" is a read mode in which the cell current is output on the bit line. "Read 2" is a read mode in which the cell current is output on the source line terminal.

FIG. 7 depicts stacked gate memory cell 710, which is another type of flash memory cell. Memory cell 710 is similar to memory cell 210 of FIG. 2, except that floating gate 20 extends over the entire channel region 18, and control gate terminal 22 (which here will be coupled to a word line) extends over floating gate 20, separated by an insulating layer (not shown). Programming is performed using hot electron injection from channel 18 to floating gate 20 in the channel region next to the drain region 16, and erasing is performed using by Fowler-Nordheim electron tunneling from floating gate 20 to substrate 12. The read operations operate in a similar manner to that described previously for memory cell 210.

Table No. 4 depicts typical voltage ranges that can be applied to the terminals of memory cell 710 and substrate 12 for performing read, erase, and program operations:

TABLE NO. 4

Operation of Flash Memory Cell 710 of FIG. 7

|  | CG | BL | SL | Substrate |
|---|---|---|---|---|
| Read 1 | 0-5 V | 0.1-2 V | 0-2 V | 0 V |
| Read 2 | 0.5-2 V | 0-2 V | 2-0.1 V | 0 V |
| Erase | −8 to −10 V/0 V | FLT | FLT | 8-10 V/15-20 V |
| Program | 8-12 V | 3-5 V/0 V | 0 V/3-5 V | 0 V |

"Read 1" is a read mode in which the cell current is output on the bit line. "Read 2" is a read mode in which the cell current is output on the source line terminal. Optionally, in arrays comprising rows and columns of memory cells 210, 310, 410, 510, 610, or 710, source lines can be coupled to one row of memory cells or to two adjacent rows of memory cells. That is, source line terminals can be shared by adjacent rows of memory cells.

FIG. 8 depicts twin split-gate memory cell 810. Twin split-gate memory cell 810 comprises a pair of memory cells (A on the left and B on the right), wherein each of the memory cells comprise a floating gate (FGA, FGB) 20 disposed over and insulated from the substrate 12, a control gate 28 (CGA, CGB) disposed over and insulated from the floating gate 20, an erase gate 30 (EG) disposed adjacent to and insulated from the floating and control gates 20/28 and disposed over and insulated from the substrate 12, where the erase gate is created with a T shape such that a top corner of each control gate CGA, CGB faces the respective inside corner of the T shaped erase gate to improve erase efficiency, and a drain region 16 (DRA, DRB) in the substrate adjacent the floating gate 20 (with a bit line contact 24 (BLA, BLB) connected to the respective drain diffusion regions 16 (DRA, DRB). The memory cells are formed as pairs of memory cells sharing a common erase gate 30. This cell design differs from that the memory cells discussed above with reference to FIGS. 2-7 at least in that it lacks a source region under the erase gate EG, lacks a select gate (also referred to as a word line), and lacks a channel region for each memory cell. Instead, a single continuous channel region 18 extends under both memory cells (i.e. extends from the drain region 16 of one memory cell to the drain region 16 of the other memory cell). To read or program one memory cell, the control gate 28 of the other memory cell is raised to a sufficient voltage to turn on the underlying channel region portion via voltage coupling to the floating gate 20 there between (e.g. to read or program cell A, the voltage on FGB is raised via voltage coupling from CGB to turn on the channel region portion under FGB). Erasing is performed using Fowler Nordheim electron tunneling from floating gate 20A and/or floating gate 20B to erase gate 30. Programming is performed using hot electron injection from channel 18 to floating gate 20.

Table No. 5 depicts typical voltage ranges that can be applied to the terminals of memory cell 810 for performing read, erase, and program operations. Cell A (FG, CGA, BLA) is selected for read, program, and erase operation

TABLE NO. 5

Operation of Flash Memory Cell 810 of FIG. 8

|  | CGA | BLA | EG | CGB | BLB |
|---|---|---|---|---|---|
| READ1 | 1.5-4 V | 0.1-0.8 V | 2.5 V | 1.5-4 V | 0 |
| ERASE | 0 V to −8 V | 0 V | 8 V to 11.5 V | 0 V to 4 V (Vcginhe) | 0 V |
| PROGRAM 1 | 10.5 V | 4.5 V | 1.5 V | 4 | Iprog |
| PROGRAM 2 | 4 V to 11.5 V | 0 V | −4 V to −11.5 V | 0 V to −2 V (Vcginhp) | 0 V |

In order to utilize the memory arrays comprising one of the types of non-volatile memory cells described above in an artificial neural network, in one embodiment, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state or from a fully erased state to a fully programmed state, independently and with minimal disturbance of other memory cells. This means the cell storage is analog or at the very least can store one of many discrete values (such as 16 or 256 different values), which allows for very precise and individual tuning of all the cells in the memory array, and which makes the memory array ideal for storing and making finely tuned synapsis weights of the neural network.

The methods and means described herein may apply to other non-volatile memory technologies such as FINFET split gate flash or stack gate flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such as SRAM, DRAM, and other volatile synapse cells, without limitation.

Neural Networks Employing Non-Volatile Memory Cell Arrays

FIG. 9 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 10 is a block diagram of a system that can be used for that purpose. VMM system 32 includes non-volatile memory cells and is utilized as the synapses (such as CB1, CB2, CB3, and CB4 in FIG. 6) between one layer and the next layer. Specifically, VMM system 32 comprises VMM array 33 comprising non-volatile memory cells arranged in rows and columns, erase gate and word line gate decoder 34, control gate decoder 35, bit line decoder 36 and source line decoder 37, which decode the respective inputs for the non-volatile memory cell array 33. Input to VMM array 33 can be from the erase gate and wordline gate decoder 34 or from the control gate decoder 35. Source line decoder 37 in this example also decodes the output of VMM array 33. Alternatively, bit line decoder 36 can decode the output of VMM array 33.

VMM array 33 serves two purposes. First, it stores the weights that will be used by the VMM system 32. Second, VMM array 33 effectively multiplies the inputs by the weights stored in VMM array 33 and adds them up per output line (source line or bit line) to produce the output, which will be the input to the next layer or input to the final layer. By performing the multiplication and addition function, VMM array 33 negates the need for separate multiplication and addition logic circuits and is also power efficient due to its in-situ memory computation.

The output of VMM array 33 is supplied to a differential summer (such as a summing op-amp or a summing current mirror) 38, which sums up the outputs of non-volatile memory cell array 33 to create a single value for that convolution. The differential summer 38 is arranged to perform summation of both positive weight and negative weight inputs to output the single value.

The summed up output values of differential summer 38 are then supplied to an activation function circuit 39, which rectifies the output. The activation function circuit 39 may provide sigmoid, tanh, ReLU functions, or any other non-linear function. The rectified output values of activation function circuit 39 become an element of a feature map of the next layer (e.g. C1 in FIG. 8), and are then applied to the next synapse to produce the next feature map layer or final layer. Therefore, in this example, VMM array 33 constitutes a plurality of synapses (which receive their inputs from the prior layer of neurons or from an input layer such as an image database), and summer 38 and activation function circuit 39 constitute a plurality of neurons.

The input to VMM system 32 in FIG. 10 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level (e.g., current, voltage, or charge), binary level, digital pulses, or digital bits (in which case an output ADC is provided to convert output analog level into digital bits).

FIG. 11 is a block diagram depicting the usage of numerous layers of VMM systems 32, here labeled as VMM systems 32a, 32b, 32c, 32d, and 32e. As shown in FIG. 11, the input, denoted Inputx, is converted from digital to analog by a digital-to-analog converter 31, and provided to input VMM system 32a. The converted analog inputs could be voltage or current. The input D/A conversion for the first layer could be done by using a function or a LUT (look up table) that maps the inputs Inputx to appropriate analog levels for the matrix multiplier of input VMM system 32a. The input conversion could also be done by an analog to analog (A/A) converter to convert an external analog input to a mapped analog input to the input VMM system 32a. The input conversion could also be done by a digital-to-digital pules (D/P) converter to convert an external digital input to a mapped digital pulse or pulses to the input VMM system 32a.

The output generated by input VMM system 32a is provided as an input to the next VMM system (hidden level 1) 32b, which in turn generates an output that is provided as an input to the next VMM system (hidden level 2) 32c, and so on. The various layers of VMM system 32 function as different layers of synapses and neurons of a convolutional neural network (CNN). Each VMM system 32a, 32b, 32c, 32d, and 32e can be a stand-alone, physical system comprising a respective non-volatile memory array, or multiple VMM systems could utilize different portions of the same physical non-volatile memory array, or multiple VMM systems could utilize overlapping portions of the same physical non-volatile memory array. Each VMM system 32a, 32b, 32c, 32d, and 32e can also be time multiplexed for various portion of its array or neurons. The example shown in FIG. 11 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

VMM Arrays

FIG. 12 depicts neuron VMM array 1200, which is particularly suited for memory cells 310 as shown in FIG. 3, and is utilized as the synapses and parts of neurons between an input layer and the next layer. VMM array 1200 comprises memory array 1201 of non-volatile memory cells and reference array 1202 (at the top of the array) of non-volatile reference memory cells. Alternatively, another reference array can be placed at the bottom.

In VMM array 1200, control gate lines, such as control gate line 1203, run in a vertical direction (hence reference array 1202 in the row direction is orthogonal to control gate line 1203), and erase gate lines, such as erase gate line 1204, run in a horizontal direction. Here, the inputs to VMM array 1200 are provided on the control gate lines (CG0, CG1, CG2, CG3), and the output of VMM array 1200 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 1200 are preferably configured to operate in a sub-threshold region.

The non-volatile reference memory cells and the non-volatile memory cells described herein are biased in sub-threshold region:

$$Ids=Io*e^{(Vg-Vth)/nVt}=w*Io*e^{(Vg)/nVt},$$

where $w=e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current Ids, into an input voltage, Vg:

$$Vg=n*Vt*\log[Ids/wp*Io]$$

Here, wp is w of a reference or peripheral memory cell.

For an I-to-V log converter using a memory cell (such as a reference memory cell or a peripheral memory cell) or a transistor to convert input current Ids, into an input voltage, Vg: Vg=n*Vt*log[Ids/wp*Io]

Here, wp is w of a reference or peripheral memory cell.

For a memory array used as a vector matrix multiplier VMM array, the output current is:

$$Iout=wa*Io*e^{(Vg)/nVt}, \text{ namely}$$

$$Iout=(wa/wp)*Iin=W*Iin$$

$$W=e^{(Vthp-Vtha)/nVt}$$

$$Iin=wp*Io*e^{(Vg)/nVt}$$

Here, wa=w of each memory cell in the memory array and wp is w of a reference or peripheral memory cell.

A wordline or control gate can be used as the input for the memory cell for the input voltage.

Alternatively, the non-volatile memory cells of VMM arrays described herein can be configured to operate in the linear region:

$$Ids=\text{beta}*(Vgs-Vth)*Vds; \text{ beta}=u*Cox*Wt/L,$$

$$W\alpha(Vgs-Vth),$$

i.e. weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Alternatively, the memory cells of VMM arrays described herein can be configured to operate in the saturation region:

$$Ids=\tfrac{1}{2}*\text{beta}*(Vgs-Vth)^2; \text{ beta}=u*Cox*Wt/L$$

$$W\alpha(Vgs-Vth)^2,$$

i.e. weight W is proportional to $(Vgs-Vth)^2$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

FIG. 13 depicts neuron VMM array 1300, which is particularly suited for memory cells 210 as shown in FIG. 2, and is utilized as the synapses between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1314 (only partially depicted) with current inputs flowing into them. The reference cells are tuned (e.g., programmed) to target reference levels. The target reference levels are provided by a reference mini-array matrix (not shown).

Memory array 1303 serves two purposes. First, it stores the weights that will be used by the VMM array 1300 on respective memory cells thereof. Second, memory array 1303 effectively multiplies the inputs (i.e. current inputs provided in terminals BLR0, BLR1, BLR2, and BLR3, which reference arrays 1301 and 1302 convert into the input voltages to supply to wordlines WL0, WL1, WL2, and WL3) by the weights stored in the memory array 1303 and then adds all the results (memory cell currents) to produce the output on the respective bit lines (BL0-BLN), which will be the input to the next layer or input to the final layer. By performing the multiplication and addition function, memory array 1303 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells, where FLT indicates floating, i.e. no voltage is imposed. The rows indicate the operations of read, erase, and program.

TABLE NO. 6

| Operation of VMM Array 1300 of FIG. 13: | | | | | |
|---|---|---|---|---|---|
| | WL | WL -unsel | BL | BL -unsel | SL | SL -unsel |
| Read | 0.5-3.5 V | −0.5 V/0 V | 0.1-2 V (Ineuron) | 0.6 V-2 V/FLT | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

FIG. 14 depicts neuron VMM array 1400, which is particularly suited for memory cells 210 as shown in FIG. 2, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 run in row direction of the VMM array 1400. VMM array is similar to VMM 1300 except that in VMM array 1400, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 7 depicts operating voltages for VMM array 1400. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 of first non-volatile reference memory cells, and reference array 1502 of second non-volatile reference memory cells. Reference arrays 1501 and 1502 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1512 (only partially shown) with current inputs flowing into them through BLR0, BLR1, BLR2, and BLR3. Multiplexors 1512 each include a respective multiplexor 1505 and a cascoding transistor 1504 to ensure a constant voltage on the bitline (such as BLR0) of each of the first and second non-volatile reference memory cells during a read operation. The reference cells are tuned to target reference levels.

Memory array 1503 serves two purposes. First, it stores the weights that will be used by the VMM array 1500. Second, memory array 1503 effectively multiplies the inputs (current inputs provided to terminals BLR0, BLR1, BLR2, and BLR3, for which reference arrays 1501 and 1502 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1500 implements uni-directional tuning for non-volatile memory cells in memory array 1503. That is, each non-volatile memory cell is erased and then partially programmed until the desired charge on the floating gate is reached. If too much charge is placed on the floating gate (such that the wrong value is stored in the cell), the cell is erased and the sequence of partial programming operations

TABLE NO. 7

| Operation of VMM Array 1400 of FIG. 14 | | | | | |
|---|---|---|---|---|---|
| | WL | WL -unsel | BL | BL -unsel | SL | SL -unsel |
| Read | 0.5-3.5 V | −0.5 V/0 V | 0.1-2 V | 0.1 V-2 V/FLT | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT | restarted. As shown, two rows sharing the same erase gate (such as EG0 or EG1) need to be erased together (which is known as a page erase), and thereafter, each cell is partially programmed until the desired charge on the floating gate is reached.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 8

Operation of VMM Array 1500 of FIG. 15

|  | WL | WL -unsel | BL | BL -unsel | CG | CG -unsel same sector | CG -unsel | EG | EG -unsel | SL | SL -unsel |
|---|---|---|---|---|---|---|---|---|---|---|---|
| Read | 0.5-2 V | −0.5 V/0 V | 0.1-2 V (Ineuron) | 0 V/FLT | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

FIG. 16 depicts neuron VMM array 1600, which is particularly suited for memory cells 310 as shown in FIG. 3, and is utilized as the synapses and parts of neurons between an input layer and the next layer. VMM array 1600 comprises a memory array 1603 of non-volatile memory cells, reference array 1601 or first non-volatile reference memory cells, and reference array 1602 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1600 is similar to VMM array 1600, except that VMM array 1600 implements bi-directional tuning, where each individual cell can be completely erased, partially programmed, and partially erased as needed to reach the desired amount of charge on the floating gate due to the use of separate EG lines. As shown, reference arrays 1601 and 1602 convert input current in the terminal BLR0, BLR1, BLR2, and BLR3 into control gate voltages CG0, CG1, CG2, and CG3 (through the action of diode-connected reference cells through multiplexors 1614) to be applied to the memory cells in the row direction. The current output (neuron) is in the bitlines BL0-BLN, where each bit line sums all currents from the non-volatile memory cells connected to that particular bitline.

Table No. 9 depicts operating voltages for VMM array 1600. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 9

Operation of VMM Array 1600 of FIG. 16

|  | WL | WL -unsel | BL | BL -unsel | CG | CG -unsel same sector | CG -unsel | EG | EG -unsel | SL | SL -unsel |
|---|---|---|---|---|---|---|---|---|---|---|---|
| Read | 1.0-2 V | −0.5 V/0 V | 0.6-2 V (Ineuron) | 0 V/FLT | 0-2.6 V | 0-2.6 V | 0-2.6 V | 0-2.6 V | 0-2.6 V | 0 V | 0 V/FLT |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

The input to the VMM arrays can be an analog level, a binary level, timing pulses, or digital bits and the output can be an analog level, a binary level, timing pulses, or digital bits (in this case an output ADC is needed to convert output analog level current or voltage into digital bits).

For each memory cell in a VMM array, each weight W can be implemented by a single memory cell or by a differential cell or by two blend memory cells (average of 2 or more cells).

In the differential cell case, two memory cells are needed to implement a weight W as a differential weight (W=W+−W−). In the two blend memory cells, two memory cells are needed to implement a weight W as an average of two cells.

One drawback of prior art arrays of non-volatile memory cells is that there is a large variance in source impedance of the array and along array output lines (such as bit lines), and a consequent variance in precision and power consumption, depending on which cell and its state is selected for a read, program, or erase operation. Another drawback is that it may be susceptible to noise.

What is needed is an improved VMM system that has a lower susceptibility to noise.

What is further needed is an improved VMM system that has a substantially constant source impedance of the array during an operation (read, program, or erase) regardless of which cell or cells are selected.

What is further needed is an improved VMM system that has a substantially constant power consumption during an operation (read, program, or erase) regardless of which cell or cells are selected.

SUMMARY OF THE INVENTION

Numerous embodiments of analog neural memory arrays are disclosed. In certain embodiments, each memory cell in the array has an approximately constant source impedance when that cell is being operated. In certain embodiments, power consumption is substantially constant from bit line to bit line within the array when cells are being read. In certain embodiments, weight mapping is performed adaptively for optimal performance in power and noise.

In one embodiment, an analog neural memory system comprises an array of non-volatile memory cells, wherein the cells are arranged in rows and columns, the columns arranged in physically adjacent pairs of columns; wherein within each adjacent pair one column in the adjacent pair comprises cells storing W+ values and one column in the adjacent pair comprises cells storing W− values, wherein adjacent cells in the adjacent pair store a differential weight, W, according to the formula W=(W+)−(W−).

In another embodiment, an analog neural memory system comprises a first array of non-volatile memory cells, wherein the cells are arranged in rows and columns and the non-volatile memory cells in one or more of the columns stores W+ values; and a second array of non-volatile memory cells, wherein the cells are arranged in rows and columns and the non-volatile memory cells in one or more of the columns stores W− values; wherein pairs of cells from the first array and the second array store a differential weight, W, according to the formula W=(W+)−(W−).

BRIEF DESCRIPTION OF THE DRAWINGS

FIG. 2 depicts a prior art split gate flash memory cell.
FIG. 3 depicts another prior art split gate flash memory cell
FIG. 4 depicts another prior art split gate flash memory cell.
FIG. 5 depicts another prior art split gate flash memory cell.

DETAILED DESCRIPTION OF THE INVENTION

The artificial neural networks of the present invention utilize a combination of CMOS technology and non-volatile memory arrays.

Embodiments of Improved VMM Systems

Figure 17:
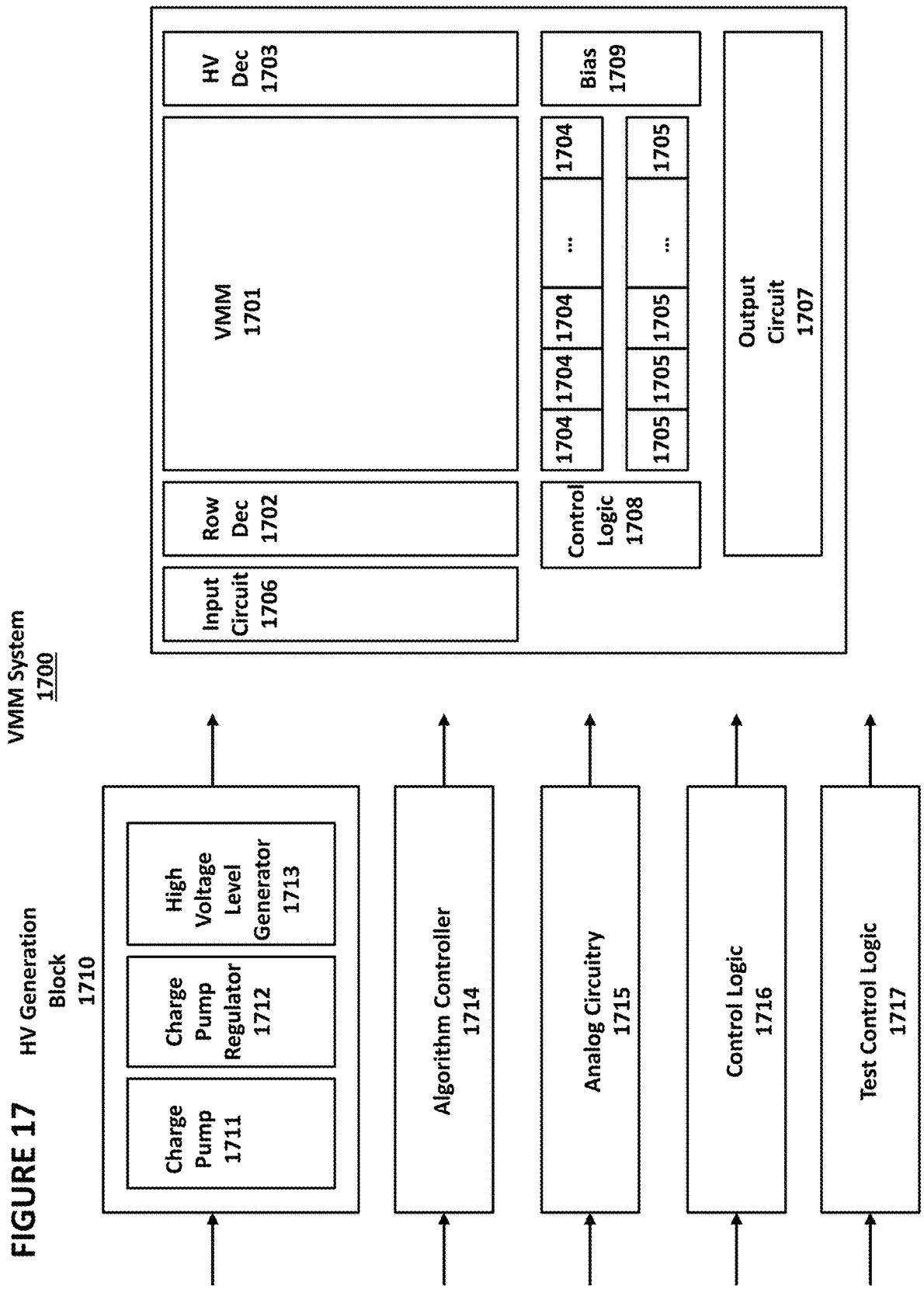
FIG. 17 depicts a VMM system.

FIG. 17 depicts a block diagram of VMM system 1700. VMM system 1700 comprises VMM array 1701, row decoders 1702, high voltage decoders 1703, column decoders 1704, bit line drivers 1705, input circuit 1706, output circuit 1707, control logic 1708, and bias generator 1709. VMM system 1700 further comprises high voltage generation block 1710, which comprises charge pump 1711, charge pump regulator 1712, and high voltage level generator 1713. VMM system 1700 further comprises algorithm controller 1714, analog circuitry 1715, control logic 1716, and test control logic 1717. The systems and methods described below can be implemented in VMM system 1700.

Input circuit 1706 may include circuits such as a DAC (digital to analog converter), DPC (digital to pulses converter), DTC (digital to time converter), AAC (analog to analog converter, such as current to voltage converter), PAC (pulse to analog level converter), or any other type of converters. Input circuit 1706 may implement normalization, scaling functions, or arithmetic functions. Input circuit 1706 may implement a temperature compensation function on the input such as modulate the output voltage/current/time/pulse(s) as a function of temperature. Input circuit 1706 may implement activation function such as ReLU or sigmoid.

Output circuit 1707 may include circuits such as a ADC (analog to digital converter, to convert neuron analog output to digital bits), AAC (analog to analog converter, such as current to voltage converter), ATC (analog to time converter), APC (analog to pulse(s) converter), or any other type of converter. Output circuit 1707 may implement activation function such as ReLU or sigmoid. Output circuit 1707 may implement statistic normalization, regularization, up/down scaling functions, statistical rounding, or arithmetic functions (e.g., add, subtract, divide, multiply, shift, log) on the neuron outputs, which are the outputs of VMM array 1701. Output circuit 1707 may implement a temperature compensation function on the neuron outputs (such as voltage/current/time/pulse(s)) or array outputs (such as bitline outputs)) such as to keep power consumption of the VMM array 1701 approximately constant or to improve precision of the VMM array 1701 (neuron) outputs such as by keeping the I-V slope approximately the same.

Figure 18A:
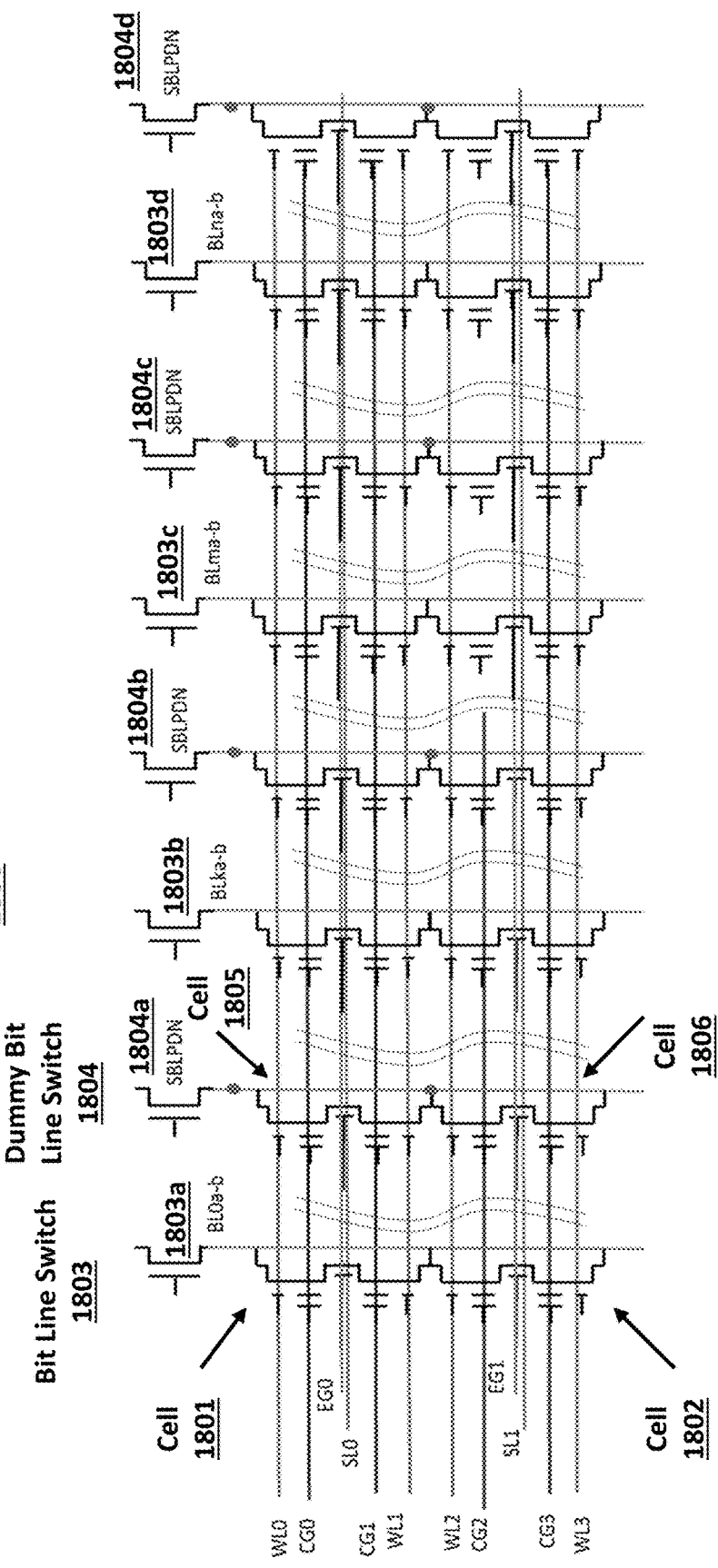
FIGS. 18A, 18B, and 18C depict a prior art VMM array.

FIG. 18A depicts prior art VMM system 1800. VMM system 1800 comprises exemplary cells 1801 and 1802, exemplary bit line switch 1803a, 1803b, 1803c, 1803d (which connects bit lines to sensing circuitry), exemplary dummy bit line switch 1804a, 1804b, 1804c, 1004d (which couples to a low bias level such as ground (or near ground) level in read), and exemplary dummy cells 1805 and 1806 (source line pull down cells). Bit line switch 1803a is coupled to a column of cells, including cells 1801 and 1802, that are used to store data in VMM system 1800. Dummy bit line switch 1804a, 1804b, 1804c, 1804 are each coupled to a column (bitline) of cells that are dummy cells are not used to store data in VMM system 1800. This dummy bitline, which can also be referred to as a source line pulldown bitline, is used as a source line pull down during read operations, meaning that it is used to pull the source line to a low bias level, such as ground (or near ground), through the dummy cells in the dummy bitline. It is to be noted that dummy bit line switch 1804a, 1804b, 1804c, 1804 and bit line switch 1803a, 1803b, 1803c, 1803d both appear on the same end of the array, i.e. they all appear at a common end of the column of cells to which they coupled, and are thus are arrayed in a single row.

Figure 18B:
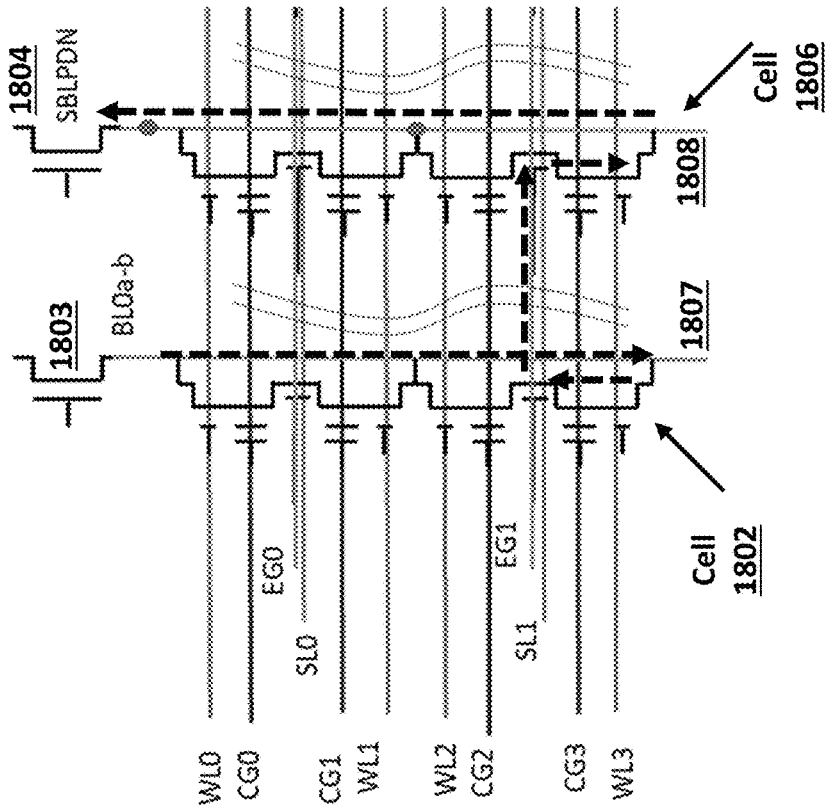
Figure 18C:
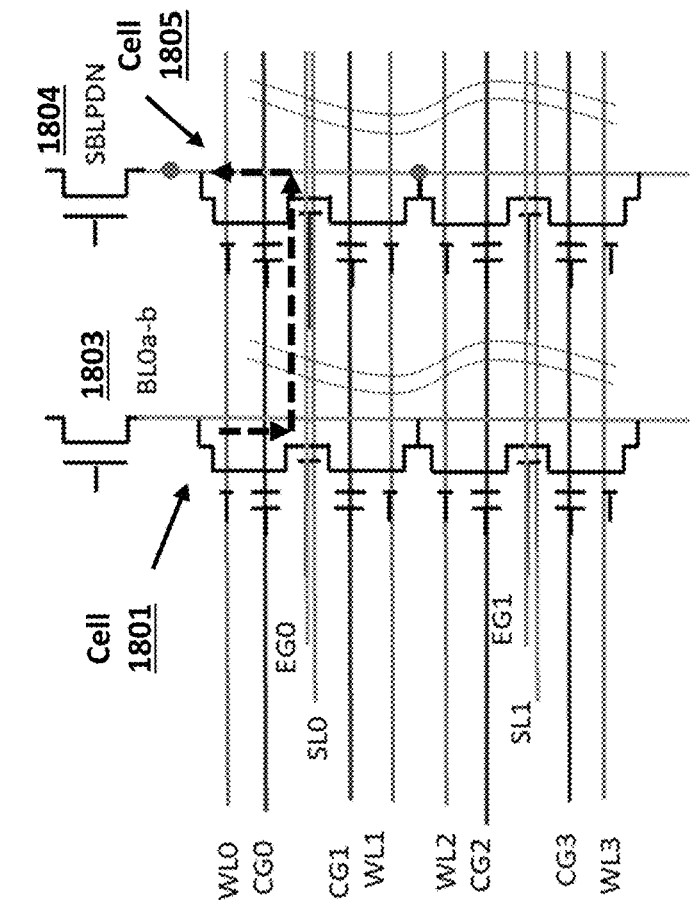

One drawback of VMM system 1800 is that the input impedance for each cell varies greatly due to the length of the electrical path through the relevant bit line switch, the cell itself, and the relevant dummy bit line switch. For example, FIG. 18B shows the electrical path through bit line switch 1803, cell 1801, dummy cell 1805, and dummy bit line switch 1804. Similarly, FIG. 18C shows the electrical path through bit line switch 1803, vertical metal bitline 1807, cell 1802, dummy cell 1806, vertical metal bitline 1808, and dummy bit line switch 1804. As can be seen, the path through cell 1802 traverses a significantly larger length of bit line and dummy bit line, which is associated with a higher capacitance and higher resistance. This results in cell 1802 having a greater parasitic impedance in the bit line or source line than cell 1801 in FIG. 18B. This variability is a drawback, for instance, because it results in a variance in the precision of the cell output as applied to read or verify (for program/erase tuning cycles) cells depending on their location within the array.

Figure 19A:
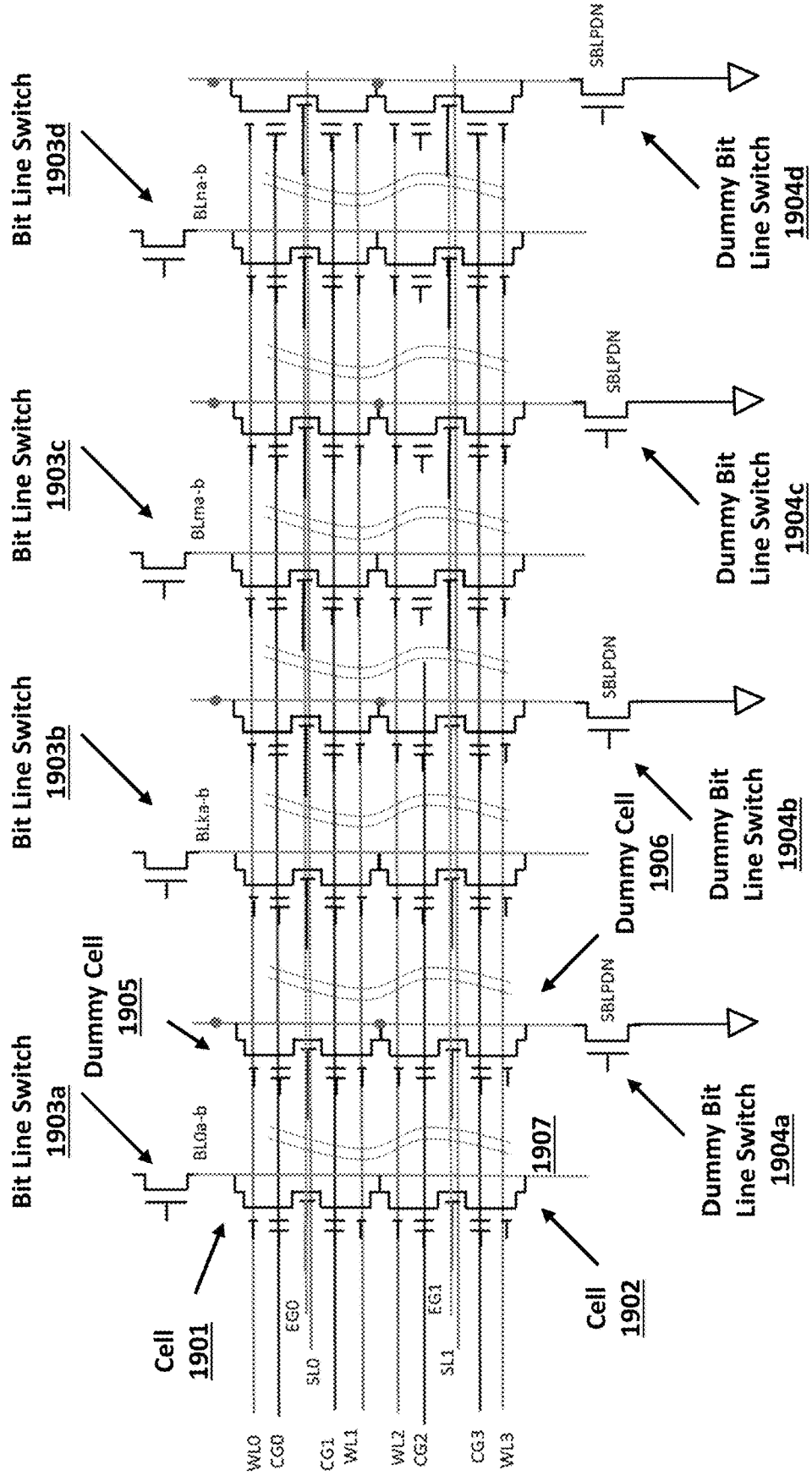
FIGS. 19A, 19B, and 19C depicts an improved VMM array.

FIG. 19A depicts VMM system 1900, which improves upon prior art VMM system 1800. VMM system 1900 comprises exemplary cells 1901 and 1902; exemplary bit line switches 1903a, 1903b, 1903c, and 1903d, which connect the bit lines to sensing circuitry; exemplary dummy cells 1905 and 1906, which can serve as source line pull down cells; and exemplary dummy bit line switches 1904a, 1904b, 1904c, and 1904d. As an example, one end of dummy bit line switch 1904a connects to a low voltage level, such as ground, during a read operation, and the other end connects to dummy cells 1905 and 1906 that are used as a source line pull down. As can be seen, exemplary dummy bit line switch 1904a and the other dummy bit line switches are located on the opposite end of the array from bit line switch 1903a and the other bit line switches.

Figure 19B:
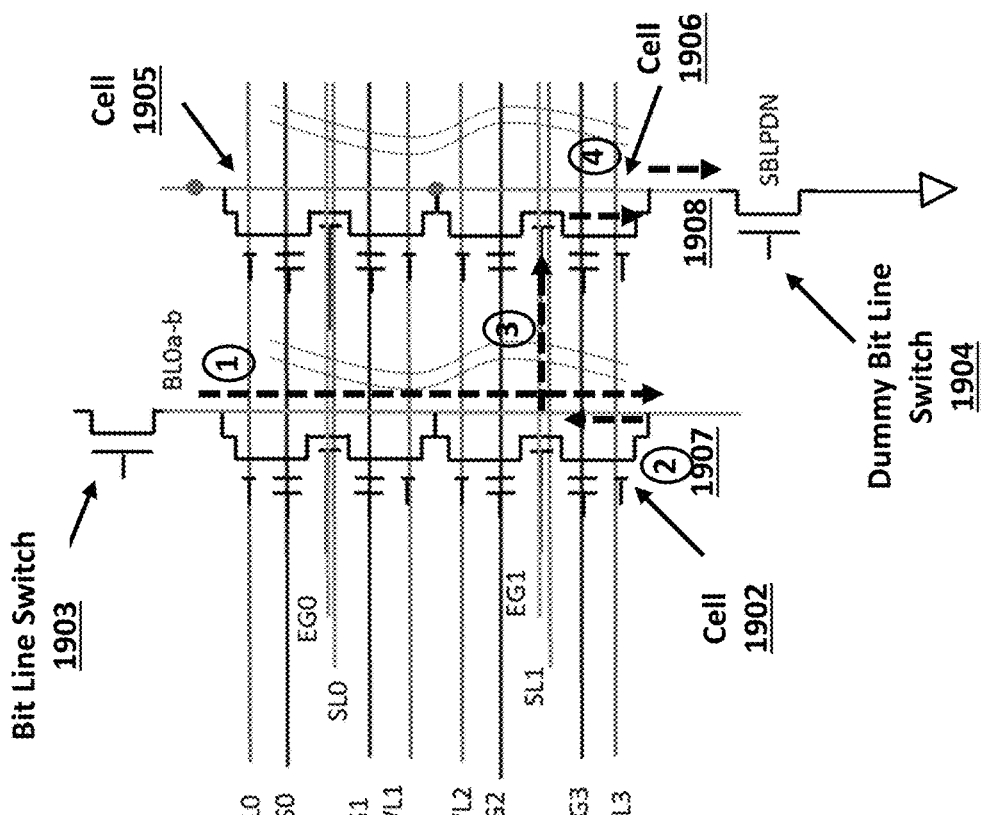
Figure 19C:
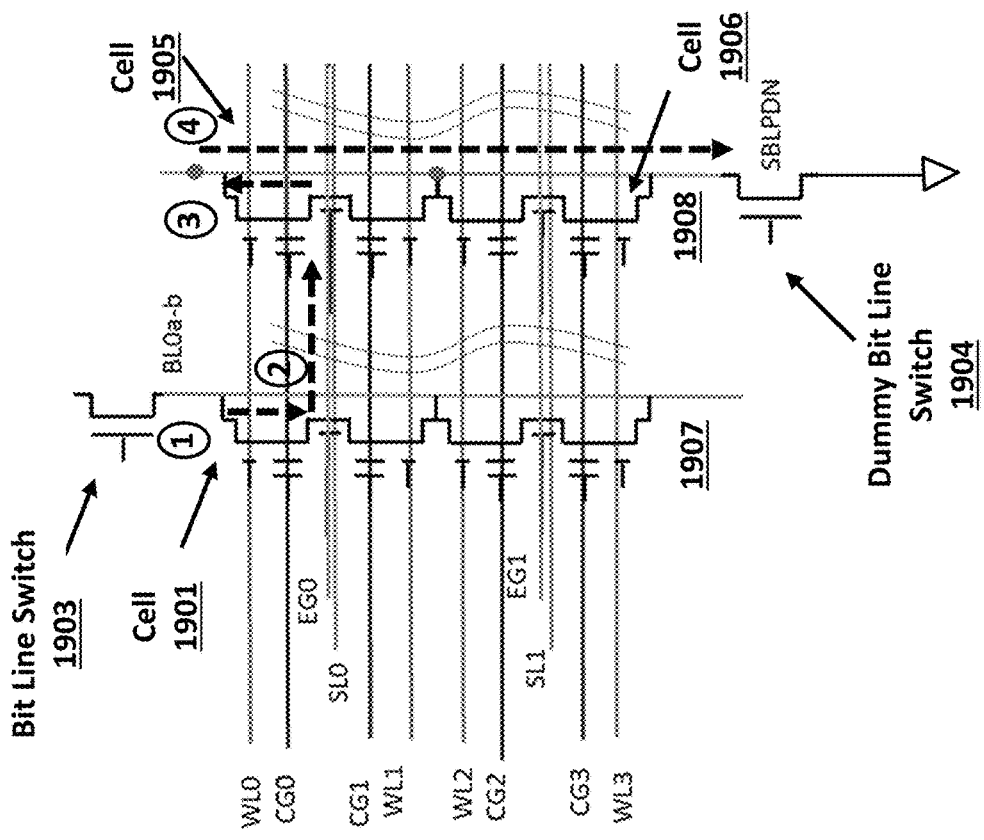

The benefit of this design can be seen in FIGS. 19B and 19C. In FIG. 19B, cell 1901 is selected for reading, and in FIG. 19C, cell 1902 is selected for reading.

FIG. 19B depicts the electrical path through bit line switch 1903, cell 1901, dummy cell 1905 (source line pull down cell), vertical metal bit line 1908, and dummy bit line switch 1904 (which couples to a low level such as ground during a read operation). FIG. 19C depicts the electrical path through bit line switch 1903, vertical metal line 1907, cell 1902, dummy cell 1906 (source line pull down cell), and dummy bit line switch 1904. The paths are substantially the same in terms of interconnect length, which is true for all cells in VMM system 1900. As a result, the impedance of the bit line impedance plus source line impedance of each cell is substantially the same, which means that the variance in the amount of parasitic voltage drop drawn during a read or verify operation of each cell in the array is substantially the same.

Figure 20:
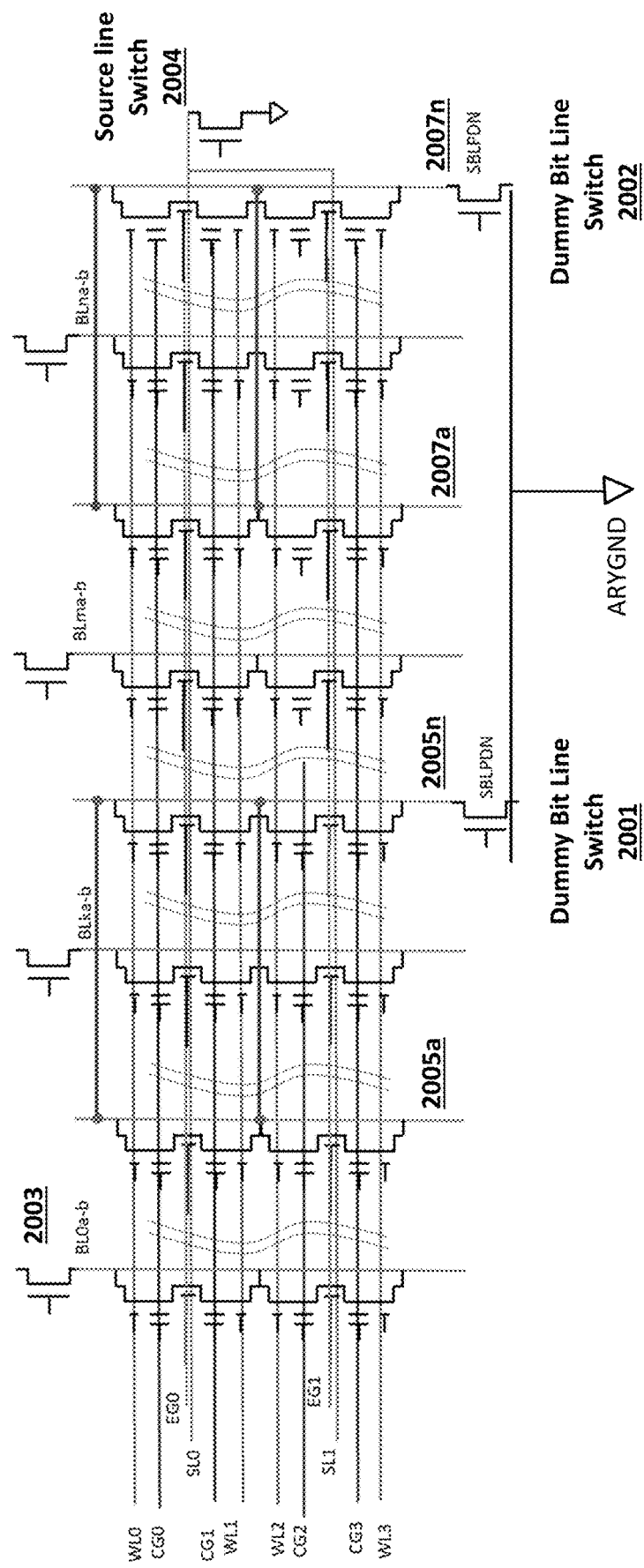
FIG. 20 depicts another improved VMM array.

FIG. 20 depicts VMM system 2000 with a global source line pulldown bitline. VMM system 2000 is similar to VMM system 1900, except that: the dummy bit lines 2005a-2005n or 2007a-2007n are connected together (to act as global source line pulldown line to pull memory cell source lines to ground level during read or verify); the dummy bit line switches, such as dummy bit line switch 2001 and 2002, are connected or coupled to a common ground, labeled ARYGND (array ground); and the source lines are coupled together to source line switch 2004, which selectively pulls the source lines to ground. These changes further decrease the variance in parasitic impedance for each cell in the array during a read or verify operation.

In an alternative embodiment, one or more dummy bit lines and one or more dummy bit line switches can be used instead of source line switch 2004 to pull the source lines to ground.

In another embodiment, dummy rows can be utilized between rows as physical barriers to avoid FG-FG coupling (of two adjacent cells) between rows.

Figure 21A:
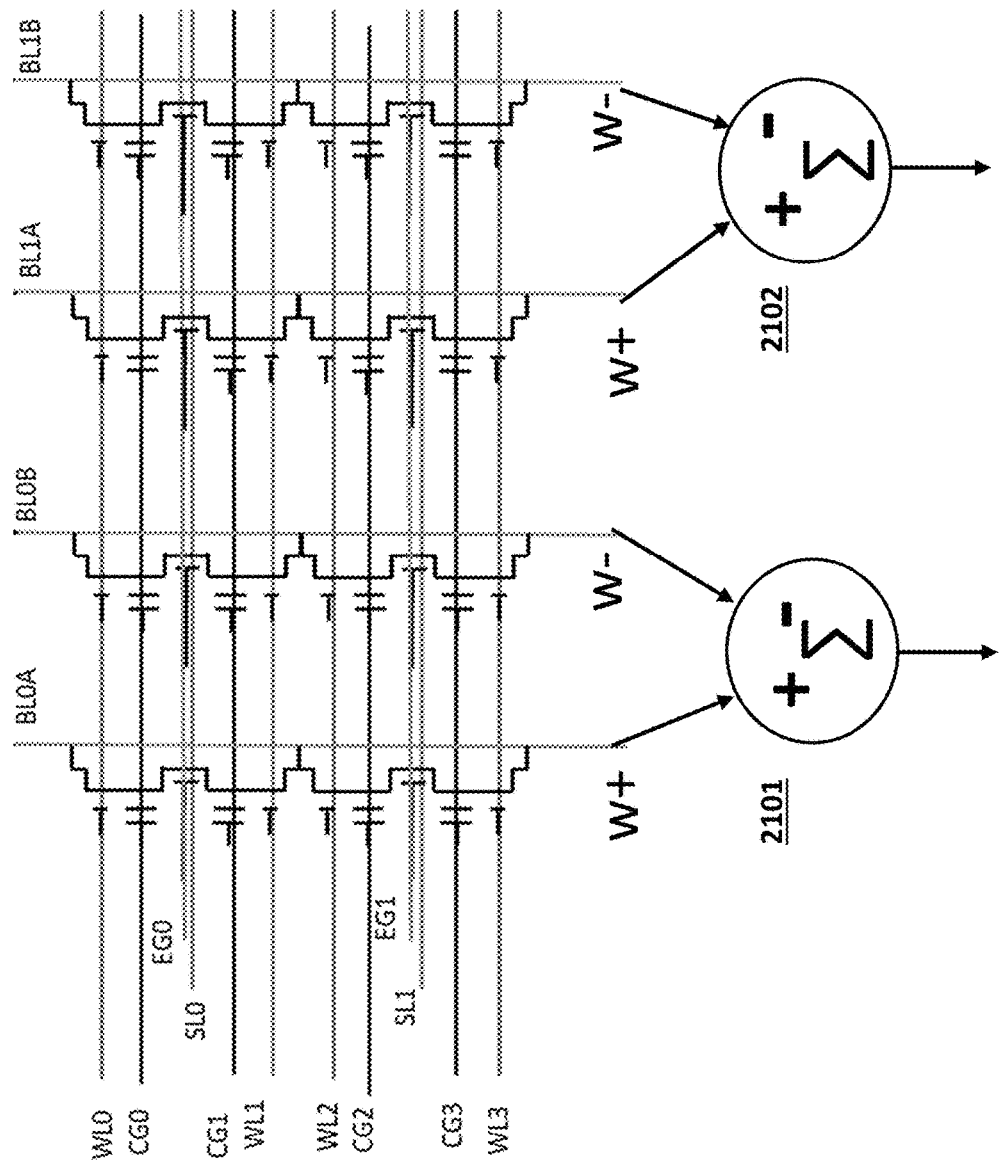
FIGS. 21A and 21B depicts another improved VMM arrays.

FIG. 21A depicts VMM system 2100. In some embodiments, the weights, W, stored in a VMM are stored as differential pairs, W+ (positive weight) and W− (negative weight), where W=(W+)−(W−). In VMM system 2100, half of the bit lines are designated as W+ lines, that is, bit lines connecting to memory cells that will store positive weights W+, and the other half of the bit lines are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 2101 and 2102. The output of a W+ line and the output of a W− line are combined together to give effectively W=W+−W− for each pair of (W+, W−) cells for all pairs of (W+, W−) lines. Optionally, dummy bitlines and source line pulldown bitlines, such as those shown in FIGS. 19 and 20, can be used in VMM system 2100 to avoid FG-FG coupling (of two adjacent cells) and/or to reduce IR voltage drop in the source line during a read or verify operation.

Figure 21B:
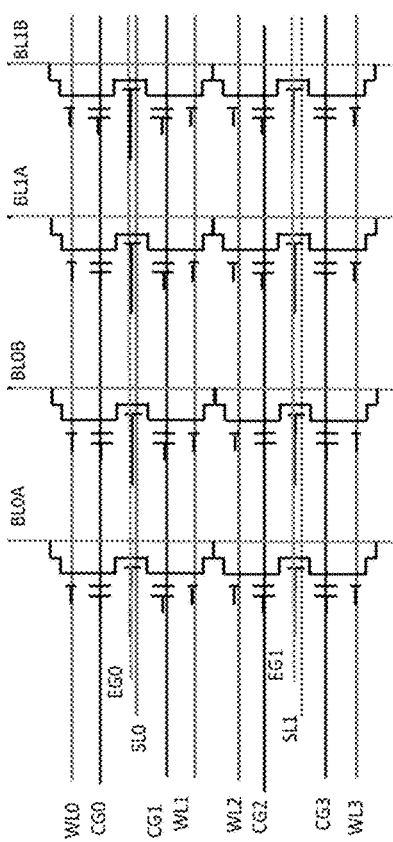
Figure 21B:
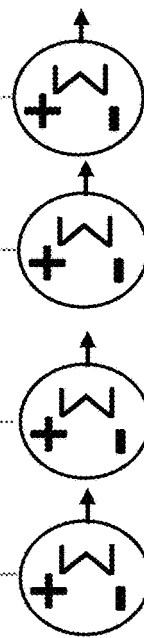
Figure 21B:
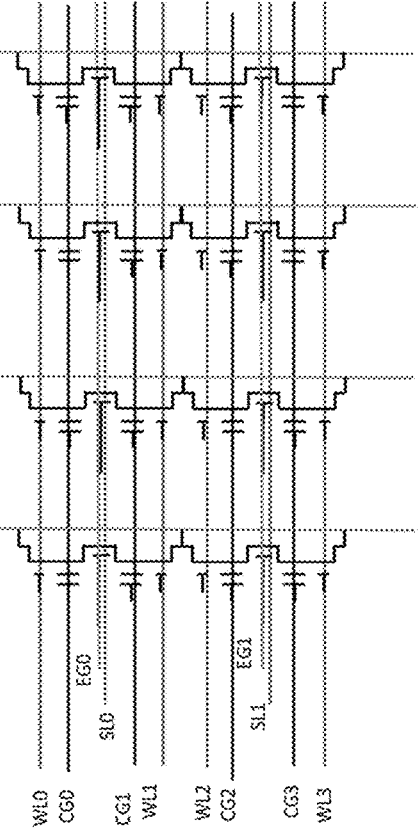

FIG. 21B depicts another embodiment. In VMM system 2110, positive weights W+ are implemented in first array 2111 and negative weights W− are implemented in a second array 2112, separate from the first array, and the resulting weights are appropriately combined together by summation circuits 2113. Optionally, dummy bitlines and source line pulldown bitlines, such as those shown in FIGS. 19 and 20, can be used in VMM system 2110 to avoid FG-FG coupling and/or to reduce IR voltage drop in the source line during a read or verify operation.

VMM systems can be designed such that W+ and W− pairs are placed within the array in a manner that reduces FG to FG coupling or distributes power consumption in a more even fashion across the array and the output circuits. This is described below with reference to Tables 10 and 11. Additional details regarding the FG to FG coupling phenomena are found in U.S. Provisional Patent Application No. 62/981,757, filed on Feb. 26, 2020 by the same assignee, and titled "Ultra-Precise Tuning of Analog Neural Memory Cells in a Deep Learning Artificial Neural Network," which is incorporated by reference herein.

Table 10A shows an exemplary physical layout of an arrangement of two pairs of (W+, W−) bit lines. One pair is BL0 and BL1, and a second pair is BL2 and BL3. In this example, 4 rows are coupled to source line pulldown bit line BLPWDN. BLPWDN is placed between each pair of (W+, W−) bit lines to prevent coupling (e.g., FG to FG coupling) between one pair of (W+, W−) bit lines with another pair of (W+, W−) bit lines. BLPWDN therefore serves as a physical barrier between pairs of (W+, W−) bit lines.

TABLE 10A

Exemplary Layout for W+, W− Pairs

| | BLPWDN | BL0 | BL1 | BLPWDN | BL2 | BL3 | BLPWDN |
|---|---|---|---|---|---|---|---|
| row0 | | W01+ | W01− | | W02+ | W02− | |
| row1 | | W11+ | W11− | | W12+ | W12− | |
| row2 | | W21+ | W21− | | W22+ | W22− | |
| row3 | | W31+ | W31− | | W32+ | W32− | |

Table 10B shows different exemplary weight combination. A '1' means that the cell is used and has a real output value, and a '0' means the cell is not used and has no value or no significant output value.

TABLE 10B

Exemplary Weight Combinations for W+, W− Pairs

| | BLPWDN | BL0 | BL1 | BLPWDN | BL2 | BL3 | BLPWDN |
|---|---|---|---|---|---|---|---|
| row0 | | 1 | 0 | | 1 | 0 | |
| row1 | | 0 | 1 | | 0 | 1 | |
| row2 | | 0 | 1 | | 1 | 0 | |
| row3 | | 1 | 1 | | 1 | 1 | |

Table 11A shows another array embodiment of a physical arrangement of (w+, w−) pair lines BL0/1 and BL2/3. The array includes redundant lines BL01 and BL23 and source line pulldown bit lines BLPWDN. Redundant bitline BL01 is used to re-map values from the pair BL0/1, and redundant bit line BL23 is used to re-map values from the pair BL2/3, which will be shown in later Tables.

TABLE 11A

Exemplary Layout for W+, W− Pairs

| | BLPWDN | BL01 | BL0 | BL1 | BL2 | BL3 | BL23 | BLPWDN |
|---|---|---|---|---|---|---|---|---|
| row0 | | | W01+ | W01− | W02+ | W02− | | |
| row1 | | | W11+ | W11− | W12+ | W12− | | |
| row2 | | | W21+ | W21− | W22+ | W22− | | |
| row3 | | | W31+ | W31− | W32+ | W32− | | |

Table 11B shows an example where the distributed weight values do not need re-mapping, basically there is no adjacent '1' between adjacent bit lines.

TABLE 11B

Exemplary Weight Combinations for W+, W− Pairs

| | BLPWDN | BL01 | BL0 | BL1 | BL2 | BL3 | BL23 | BLPWDN |
|---|---|---|---|---|---|---|---|---|
| row0 | | | 1 | 0 | 1 | 0 | | |
| row1 | | | 0 | 1 | 0 | 1 | | |
| row2 | | | 1 | 0 | 1 | 0 | | |
| row3 | | | 0 | 1 | 0 | 1 | | |

Table 11C shows an example where distributed weights needs to be re-mapped. Here, there are adjacent '1's in BL1 and BL3, which causes adjacent bit line coupling. The values therefore are re-mapped as shown in Table 11D, resulting in no adjacent '1' values between any adjacent bit lines. In addition, by re-mapping, the total current along the bit line is now reduced, which leads to a more precise value in that bit line, which also leads to more distributed power consumption along the bit lines. Optionally, additional bit-lines (BL01, BL23) optionally can be used to act as redundant columns.

TABLE 11C

Exemplary Weight Combinations for w+, w− Pairs

| | BLPWDN | BL01 | BL0 | BL1 | BL2 | BL3 | BL23 | BLPWDN |
|---|---|---|---|---|---|---|---|---|
| row0 | | | 0 | 1 | 1 | 0 | | |
| row1 | | | 0 | 1 | 1 | 0 | | |
| row2 | | | 0 | 1 | 1 | 0 | | |
| row3 | | | 0 | 1 | 1 | 0 | | |

TABLE 11D

Remapped Weight Combinations for w+, w− Pairs

| | BLPWDN | BL01 | BL0 | BL1 | BL2 | BL3 | BL23 | BLPWDN |
|---|---|---|---|---|---|---|---|---|
| row0 | | 0 | 0 | 1 | 0 | 0 | 1 | |
| row1 | | 1 | 0 | 0 | 1 | 0 | 0 | |
| row2 | | 0 | 0 | 1 | 0 | 0 | 1 | |
| row3 | | 1 | 0 | 0 | 1 | 0 | 0 | |

Tables 11E and 11F depict another embodiments of remapping noisy cells (or defective cells) into the redundant columns such as BL01, BL23 in Table 11E or BL0B and BL1B in Table 11F.

TABLE 11E

Remapped Weight Combinations for w+, w− Pairs

| | BLPWDN | BL01 | BL0 | BL1 | BL2 | BL3 | BL23 | BLPWDN |
|---|---|---|---|---|---|---|---|---|
| row0 | | | 0 | 0 | 1 | 0 | 0 | 1 |
| row1 | | | 1 | 0 | noisy or defective cell (not used) | 1 | 0 | 0 |
| row2 | | | 0 | 0 | 1 | noisy or defective cell (not used) | 0 | 1 |
| row3 | | | 1 | 0 | 0 | 1 | 0 | 0 |

TABLE 11F

Remapped Weight Combinations for w+, w− Pairs

| | BLPWDN | BL0A | BL0B | BL1A | BL1B | BLPWDN |
|---|---|---|---|---|---|---|
| row0 | | 1 | 0 | 0 | 0 | |
| row1 | | noisy or defective cell (not used) | 1 | 1 | 0 | |
| row2 | | 1 | 0 | noisy or defective cell (not used) | 1 | |
| row3 | | 0 | 0 | 1 | 0 | |

Table 11G shows an embodiment of a physical arrangement of an array that is suitable for FIG. 21B. Since each bitline has either a positive weight or a negative weight, a dummy bitline acting as source line pull down or a real dummy bitline (not used, e.g., deeply or partially programmed or partially erased) and physical barrier to avoid FG-FG coupling is needed for each bit line.

TABLE 11G

Exemplary Layout for w+, w− Pairs

| | BLPWDN | BL0 | BLPWDN | BL1 | BLPWDN |
|---|---|---|---|---|---|
| row0 | | W01+/− | | W02+/− | |
| row1 | | W11+/− | | W12+/− | |
| row2 | | W21+/− | | W22+/− | |
| row3 | | W31+/− | | W32+/− | |

Figure 1:
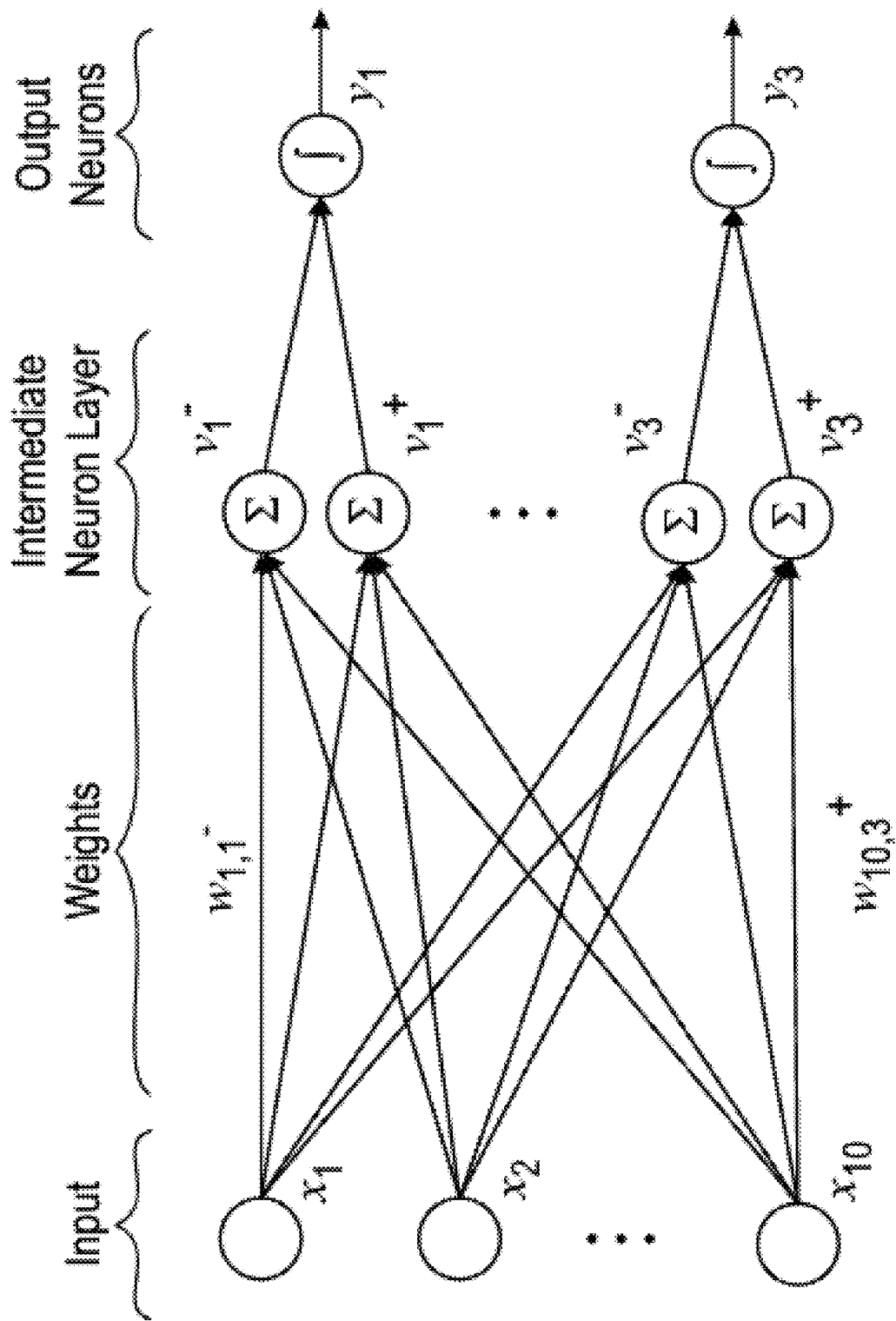
FIG. 1 depicts a prior art artificial neural network.
Figure 6:
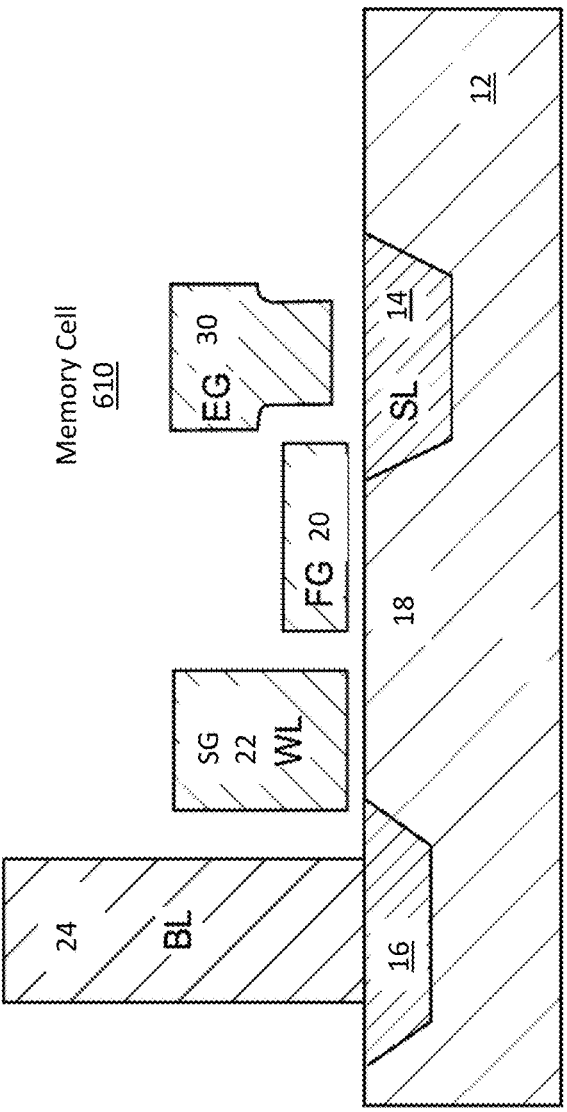
FIG. 6 depicts another prior art split gate flash memory cell.
Figure 7:
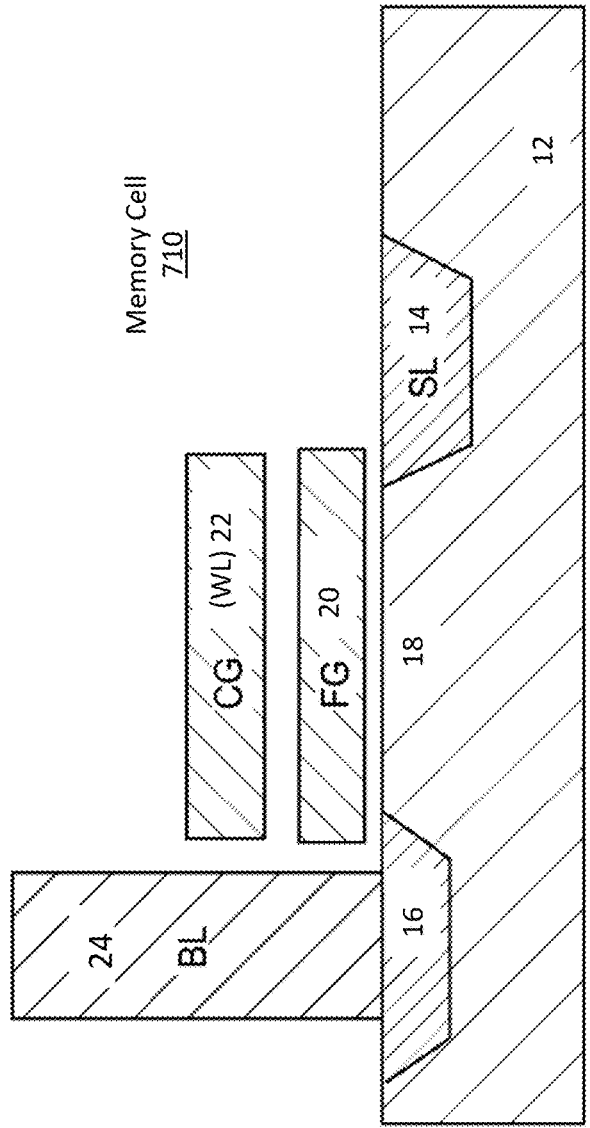
FIG. 7 depicts a prior art stacked gate flash memory cell.
Figure 8:
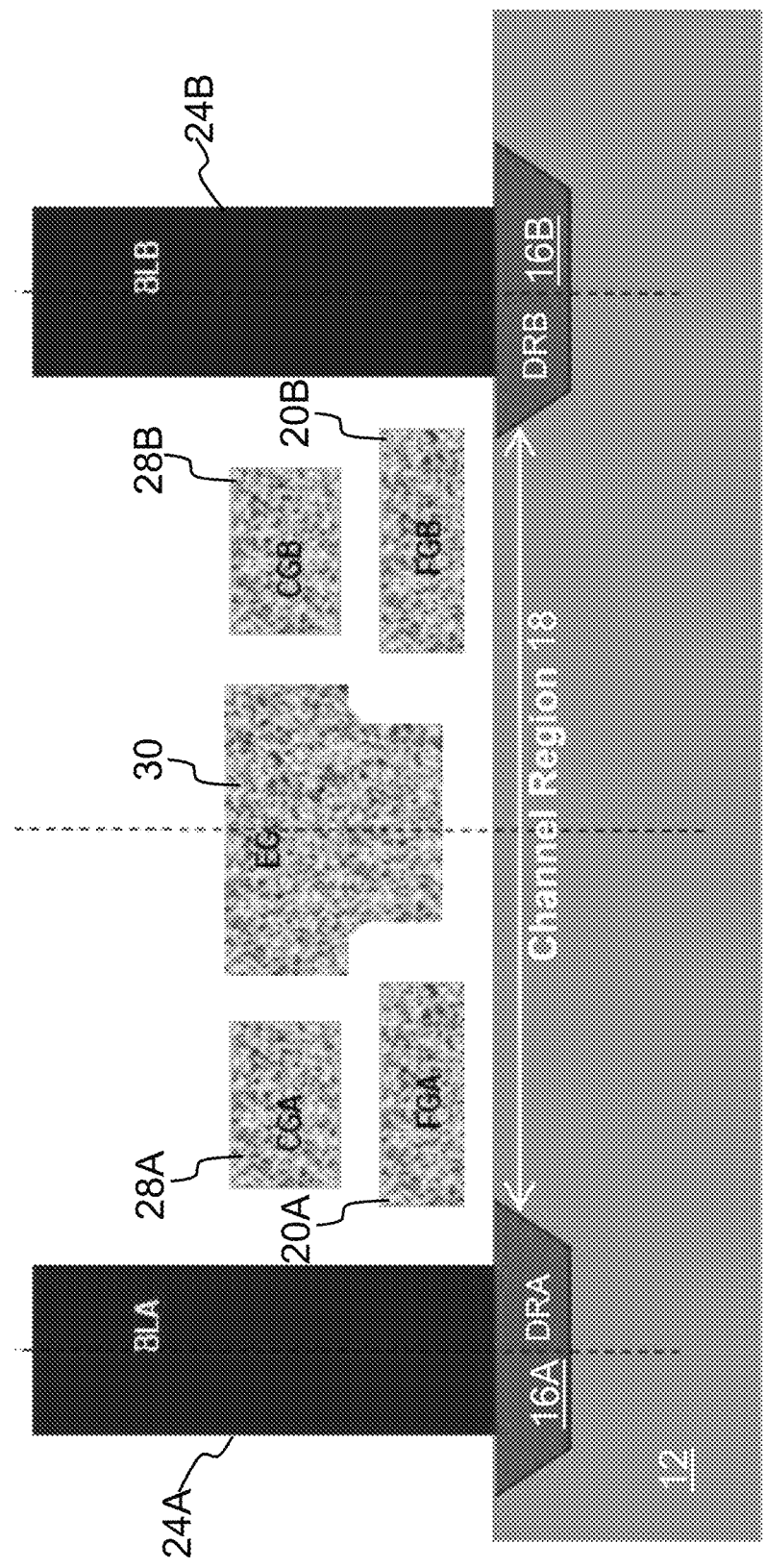
FIG. 8 depicts a twin split-gate memory cell.
Figure 9:
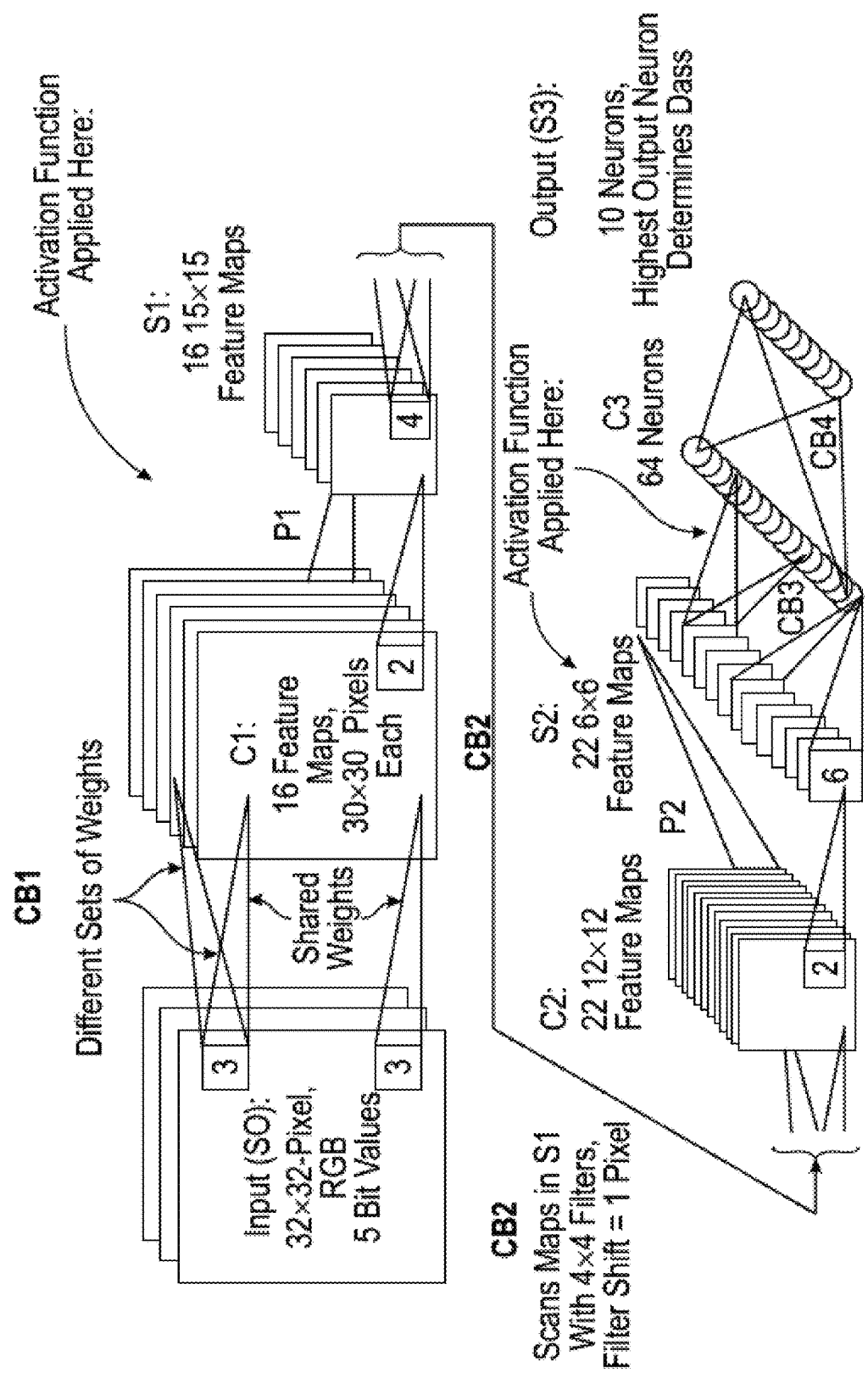
FIG. 9 depicts different levels of an exemplary artificial neural network utilizing one or more VMM arrays.
Figure 10:
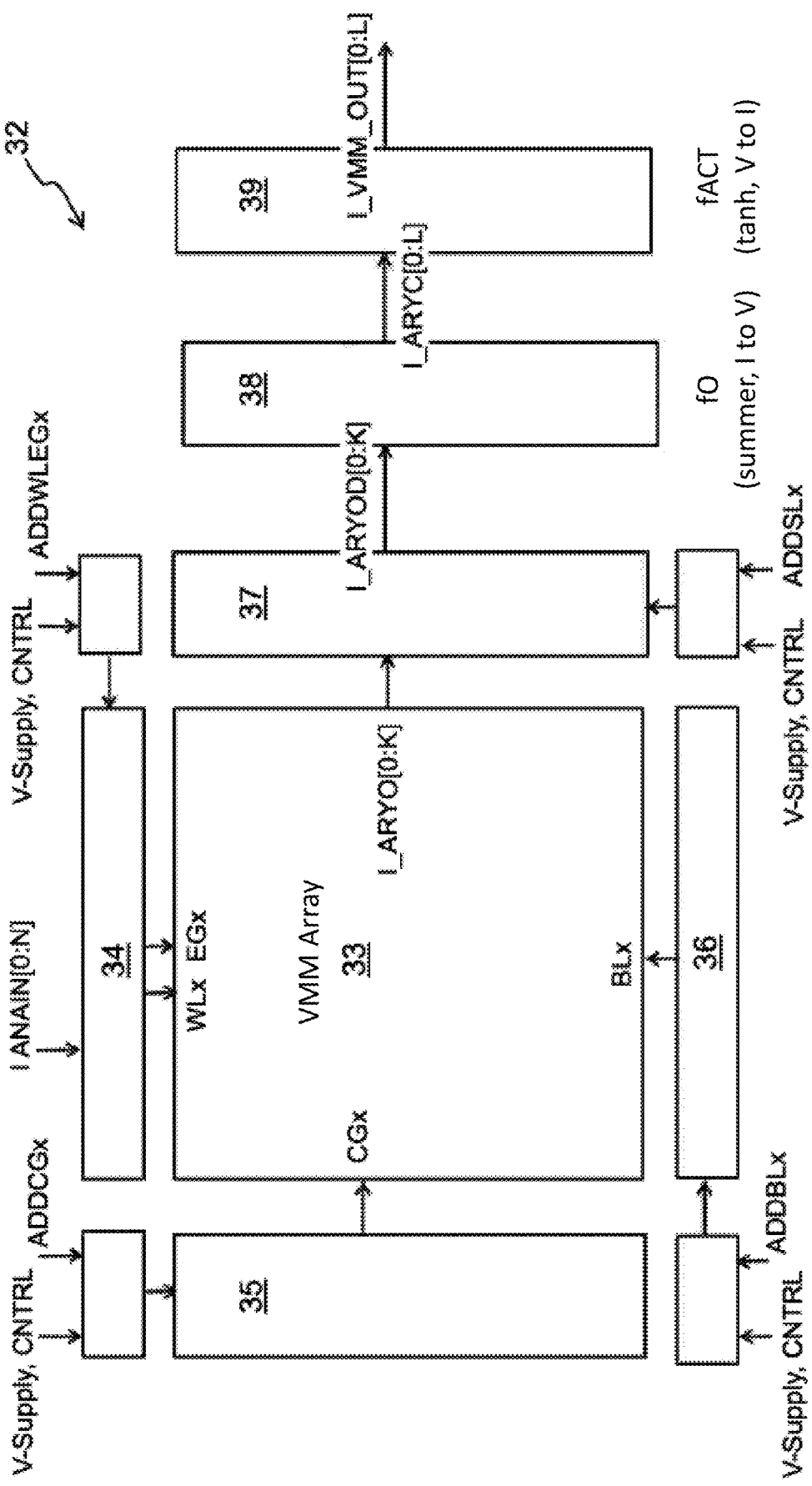
FIG. 10 depicts a VMM system comprising a VMM array and other circuitry.
Figure 11:
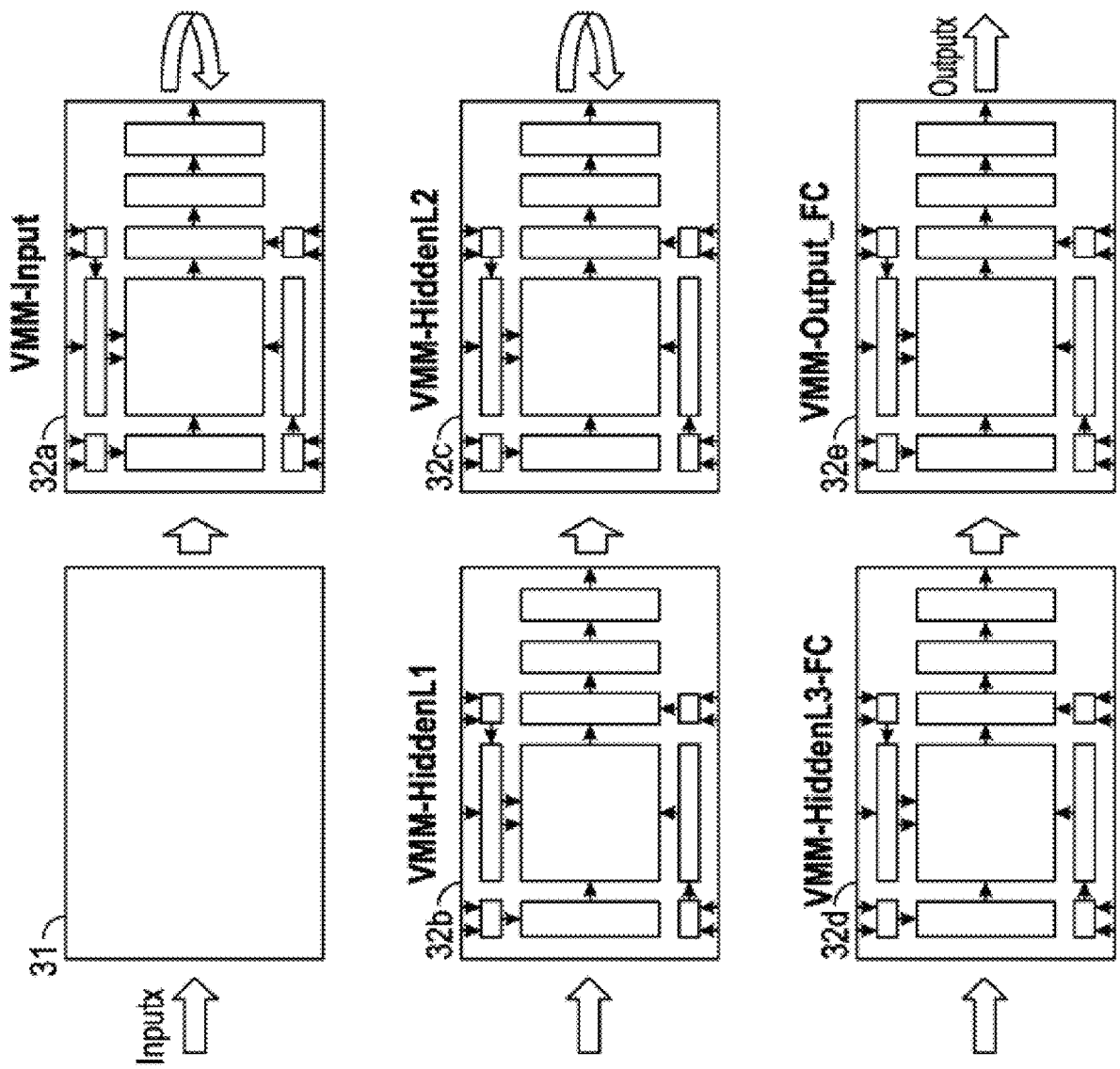
FIG. 11 depicts an exemplary artificial neural network utilizing one or more VMM systems.
Figure 12:
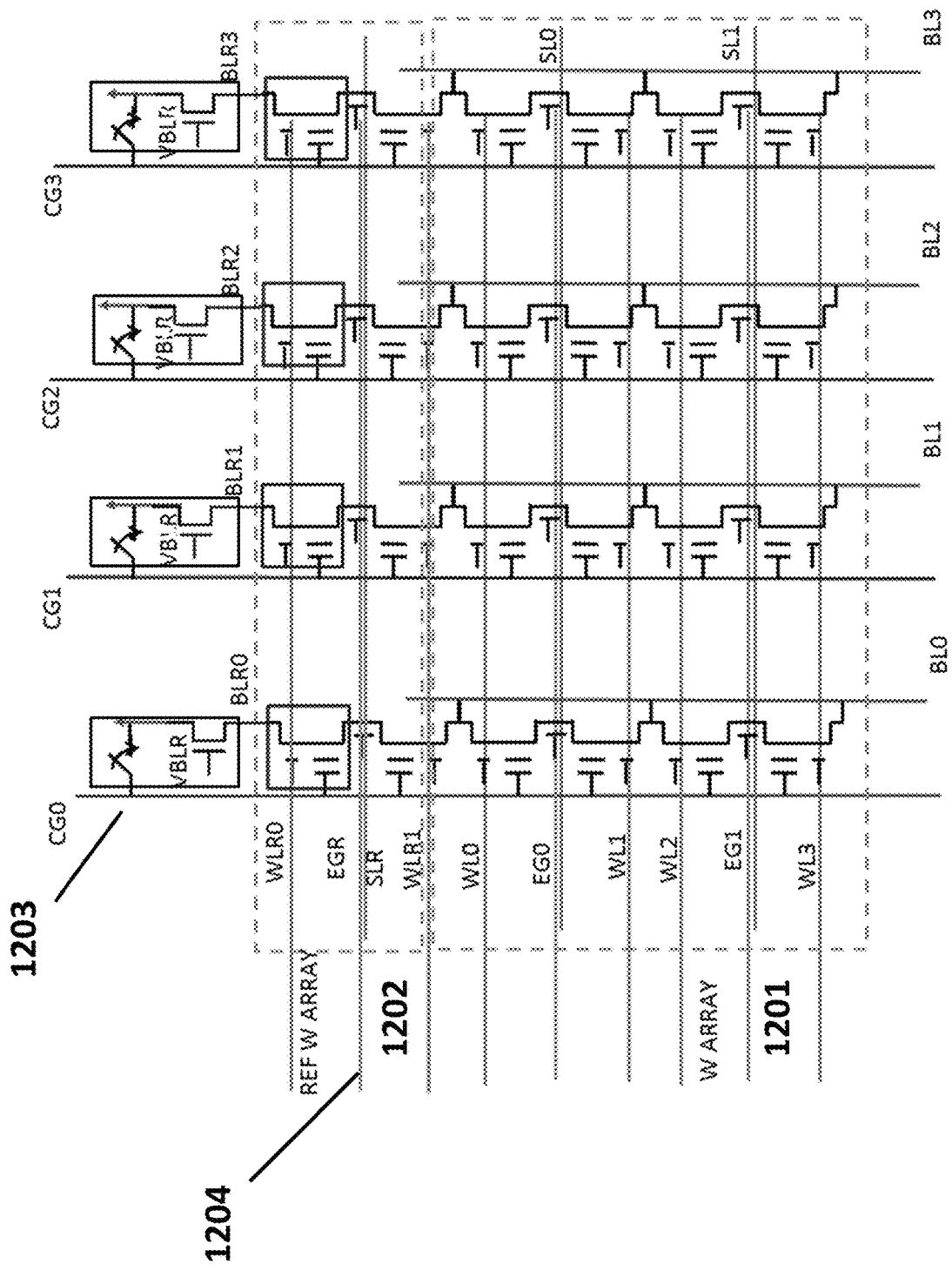
FIG. 12 depicts an embodiment of a VMM array.
Figure 13:
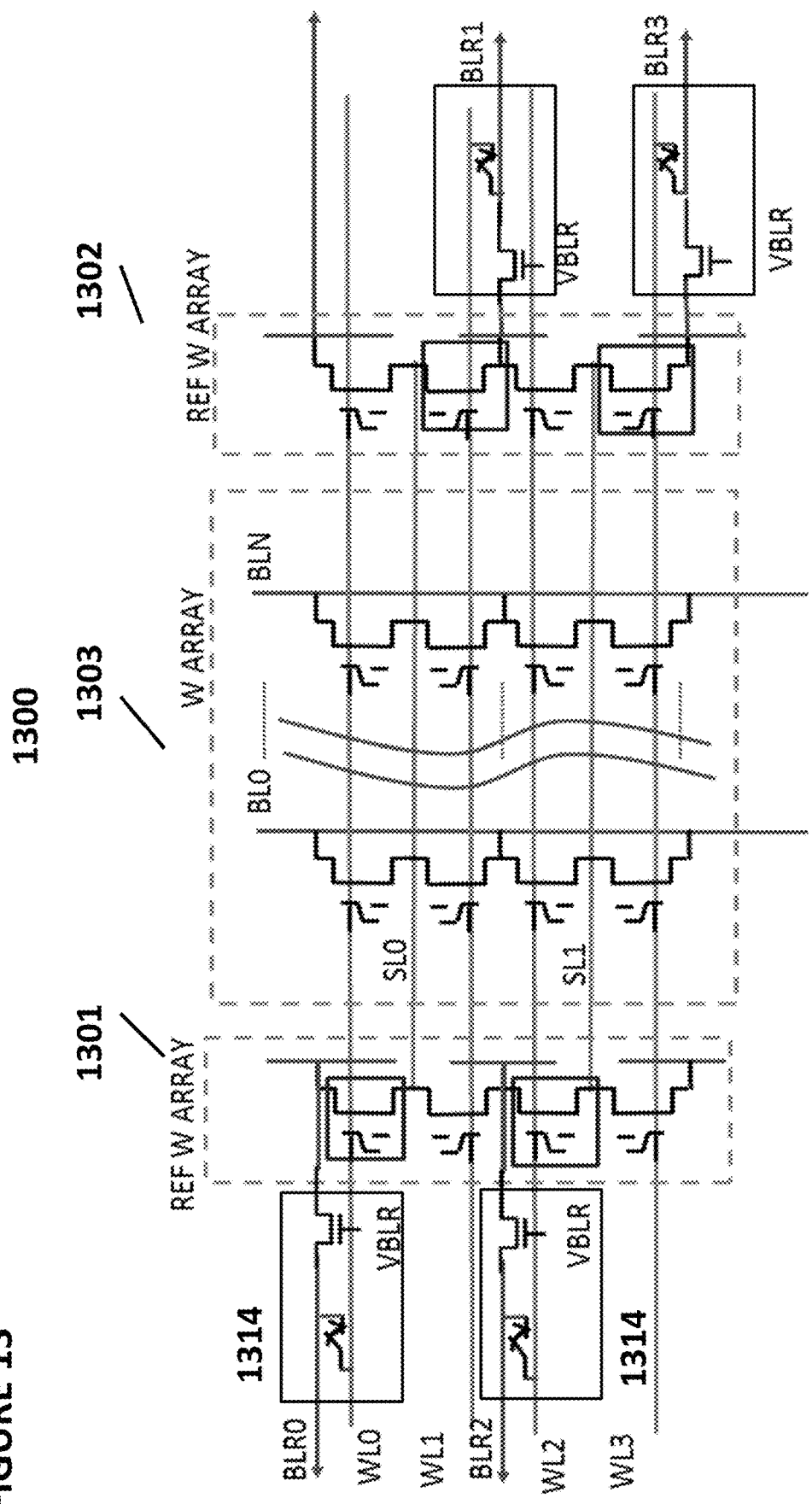
FIG. 13 depicts another embodiment of a VMM array.
Figure 14:
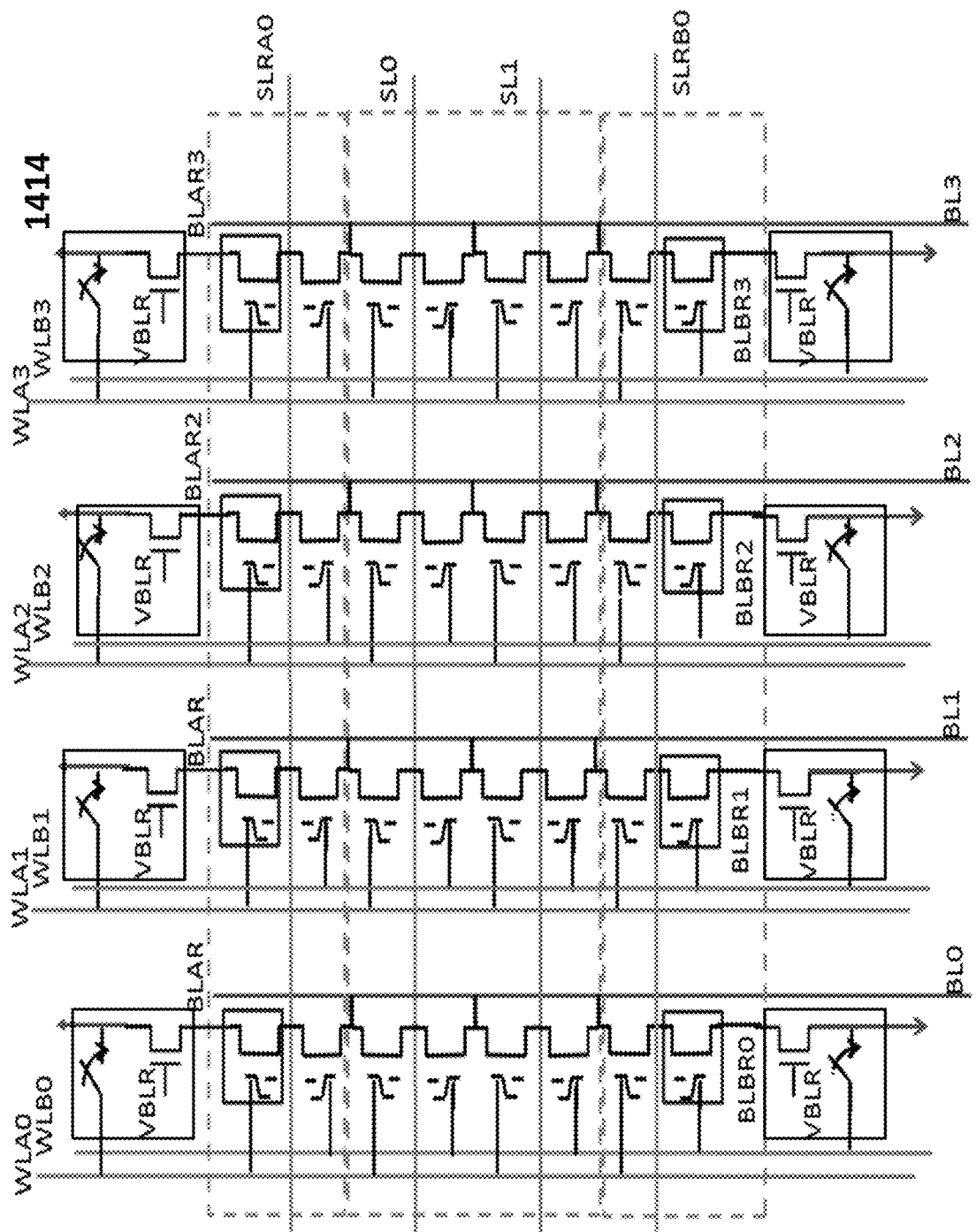
FIG. 14 depicts another embodiment of a VMM array.
Figure 15:
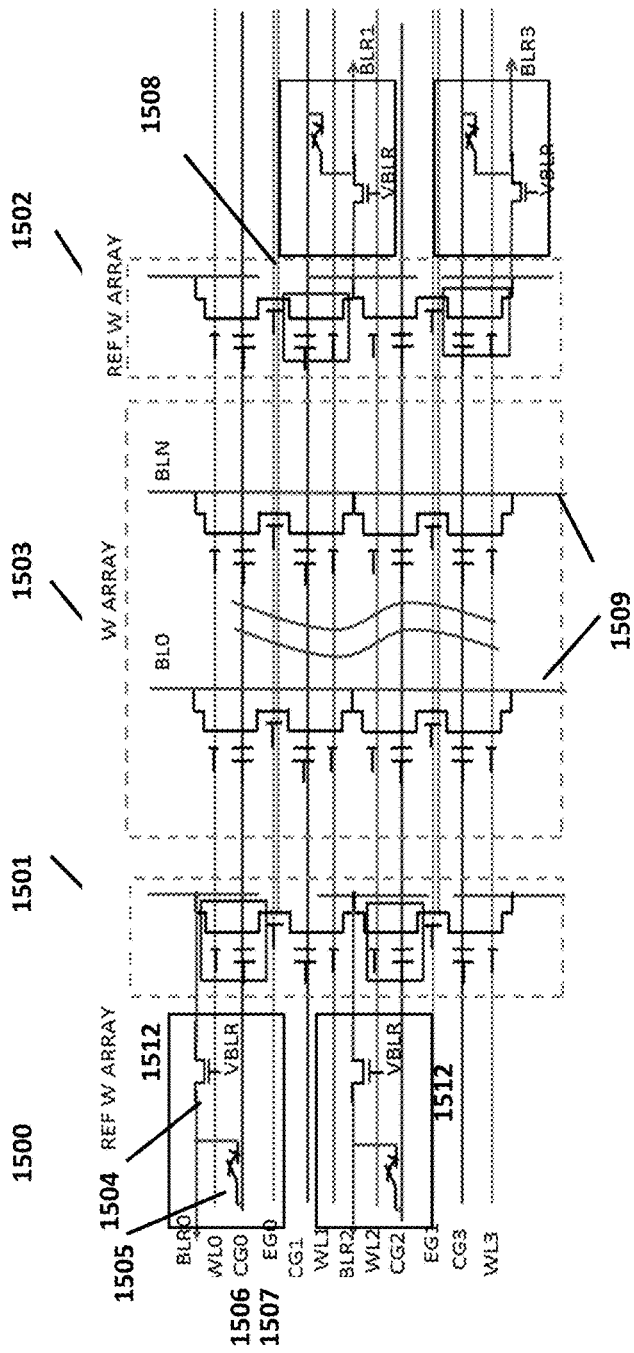
FIG. 15 depicts another embodiment of a VMM array.
Figure 16:
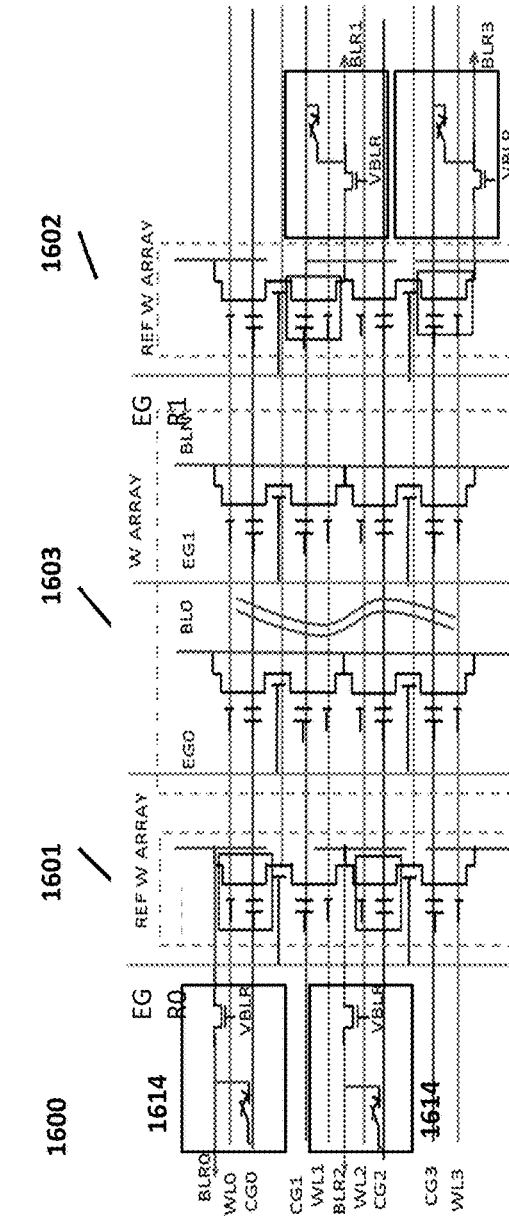
FIG. 16 depicts another embodiment of a VMM array.

In FIGS. 10$x$ to 11$x$, source line pulldown bit line BLPWDN can be implemented as a real dummy bitline BLDUM or as isolation bitlines BLISO, meaning these bitlines serve to isolate the data bitlines from each other so FG-FG coupling of adjacent cells is avoided. These bitlines are not used so they are tuned (programmed or erased) to a state that does not cause FG-FG coupling or leave them vulnerable to being disturbed by other cells being tuned (either programmed or erased) in the same row or the same sector, e.g., deeply or partially programmed cells or partially erased cells so that FG voltage is at a low level state.

In another embodiment, a tuning bit line coupled to a column of cells is adjacent to a target bitline coupled to a column of cells, and the tuning bit line cells are used to tune the target bitline cells to desired target values during a programming operation using the FG-FG coupling between adjacent cells. Optionally, a source line pull down bitline can be used on the side of the target bit line opposite the side adjacent to the tuning bitline.

Alterative embodiments for mapping noisy or defective cells can be implemented where such cells are designated as non-used cells, meaning they are to be (deeply) programmed to not contribute any value to the neuron output.

Alternative embodiments for identifying fast cells (which are cells that can be programmed to reach a certain value faster than a typical cell) can be implemented, where fast cells are identified and undergo a more precise tuning algorithm to not overshoot the target during a programming operation.

Figure 22:
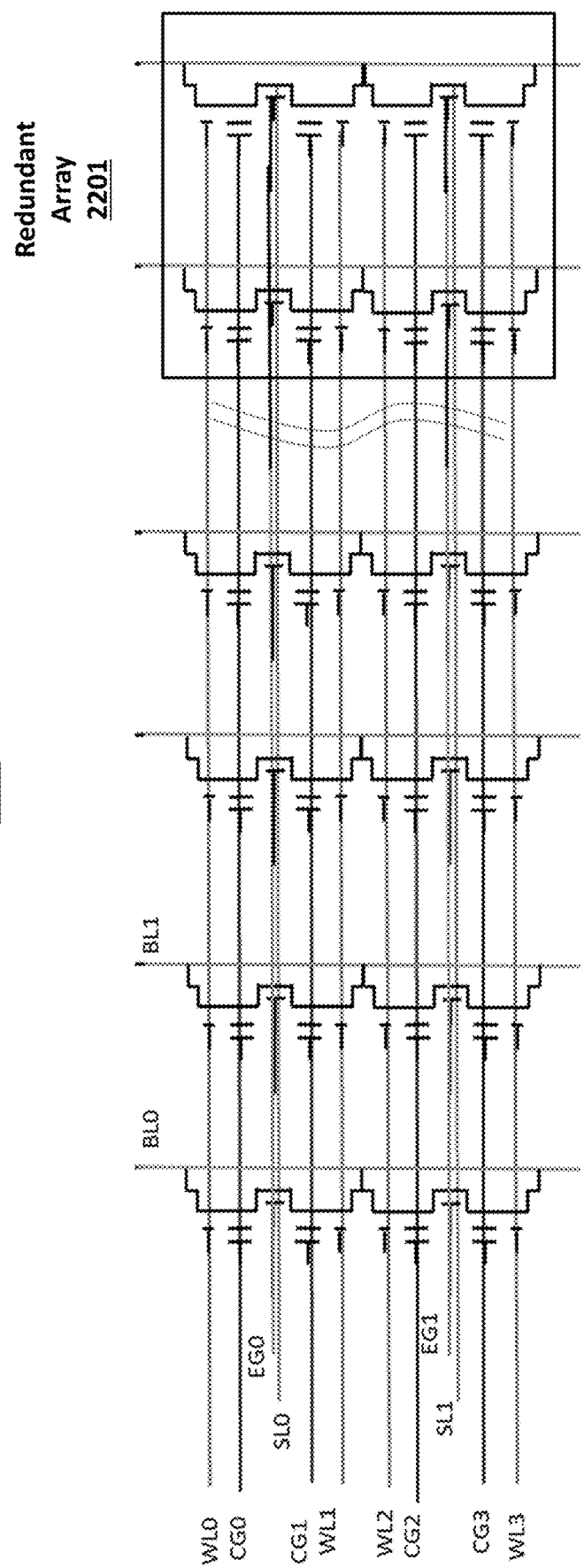
FIG. 22 depicts another improved VMM array comprising a redundant array.

FIG. 22 depicts VMM system 2200. VMM system 2200 comprises redundant array 2201 that can be included in any of the VMM arrays discussed thus far. Redundant array 2201 can be used as redundancy to replace defective columns if any of the columns attached to bit line switches are deemed defective. The redundant array can have its own redundant array (neuron) outputs (e.g., bit lines), and/or redundant write and verify circuits, and/or ADC circuits for redundancy purpose. For example, when redundancy is needed, the output of the redundant ADC will replace the output of the ADC of the bad bit line. Redundant array 2201 can also be used for weight mapping such as described in Tables 10A and 10B to achieve a relatively even power distribution among bit lines.

Figure 23:
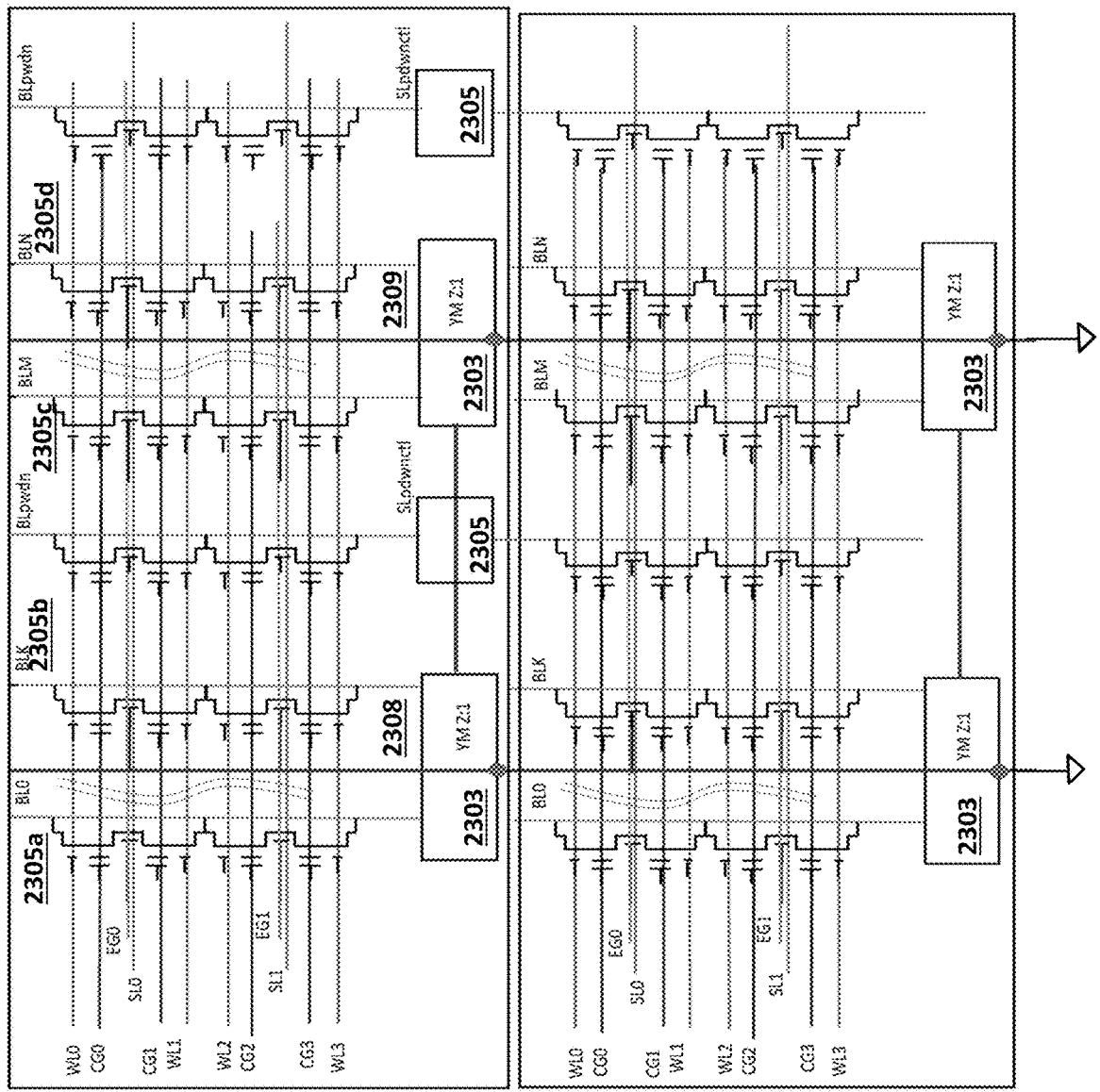
FIG. 23 depict another improved VMM system that comprises two VMM arrays and shared dummy bit line switching circuitry.

FIG. 23 depicts VMM system 2300, which comprises array 2301, array 2302, column multiplexors 2303, local bit lines LBL 2305a-d, global bit lines GBL 2308 and 2309, and dummy bit line switches 2305a-2305d. The column multiplexors 2303 are used to select the respective top local bit line 2305 of the array 2301 or bottom local bit line 2305 of the array 2302 into the global bit line 2308. In one embodiment, the (metal) global bit line 2308 has the same number of lines as number of the local bit lines, e.g. 8 or 16. In another embodiment, the global bit line 2308 has only one (metal) line per N number of local bit lines, such as one global bit line per 8 or 16 local bit lines. The column multiplexors 2303 can multiplex an adjacent global bit line (such as GBL 2309) into a global bit line of interest (such as GBL 2308) to effectively increase the width of the current global bit line. This reduces the voltage drop across the global bit line of interest (GBL 2308).

Various output circuits will now be described that can be used with any of the VMM systems described herein.

Figure 24:
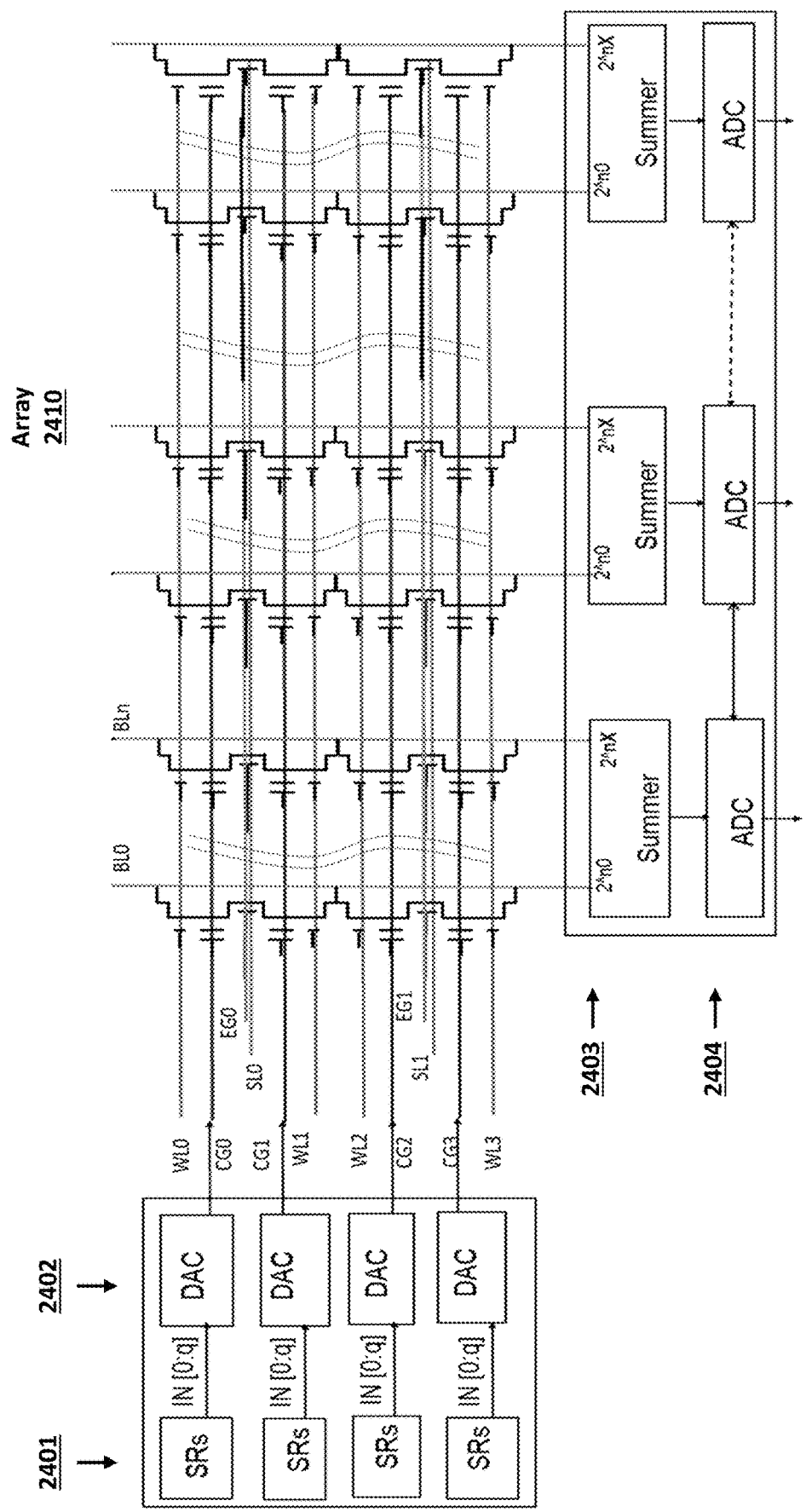
FIG. 24 depicts another improved VMM system.

FIG. 24 depicts VMM system 2400. VMM system 2400 comprises array 2410; shift registers (SRs) 2401; digital-to-analog converters (DAC) 2402, which receives the input from the SRs 2401 and output an equivalent (analog or pseudo-analog) level or information (e.g., voltage/timing); summer circuits 2403; analog-to-digital converters (ADC) 2404; and bit line switches (not shown). Dummy bit lines and dummy bit line switches are present but not shown. As shown, ADC circuits can be combined together to create a single ADC with greater precision (i.e., greater number of bits).

Figure 25:
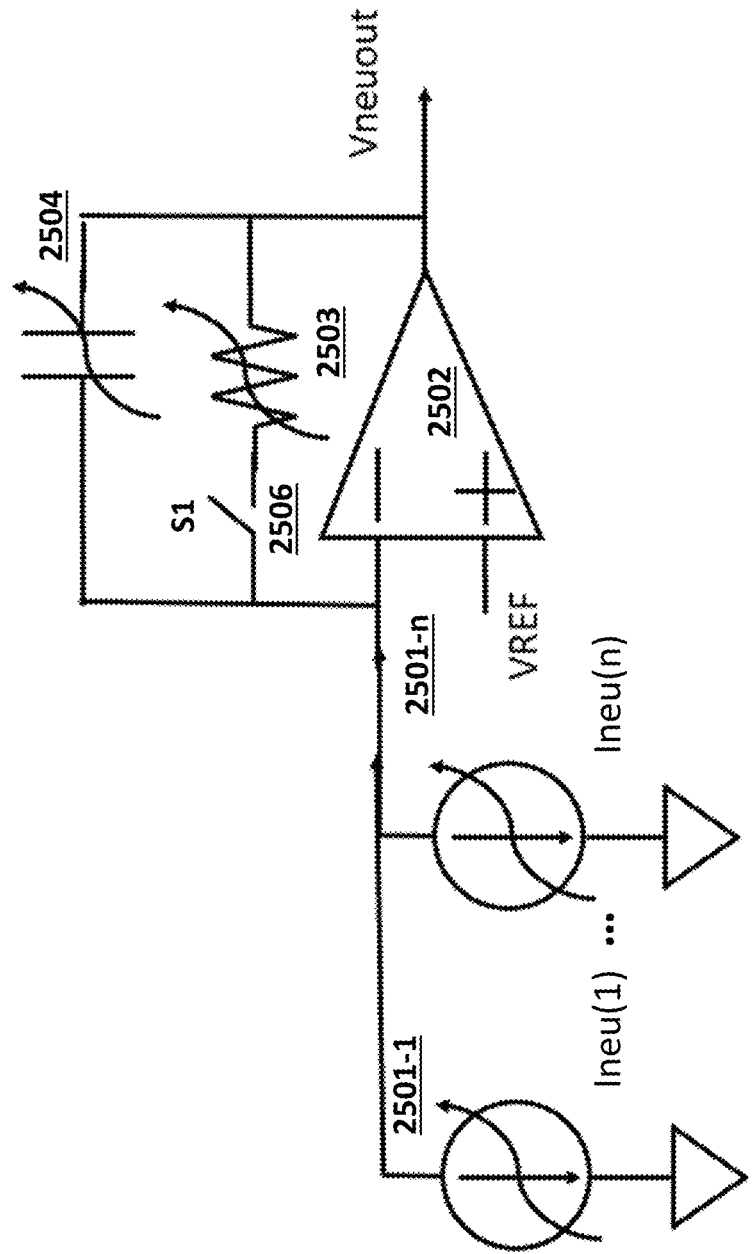
FIG. 25 depicts an embodiment of a summer circuit.
Figure 26:
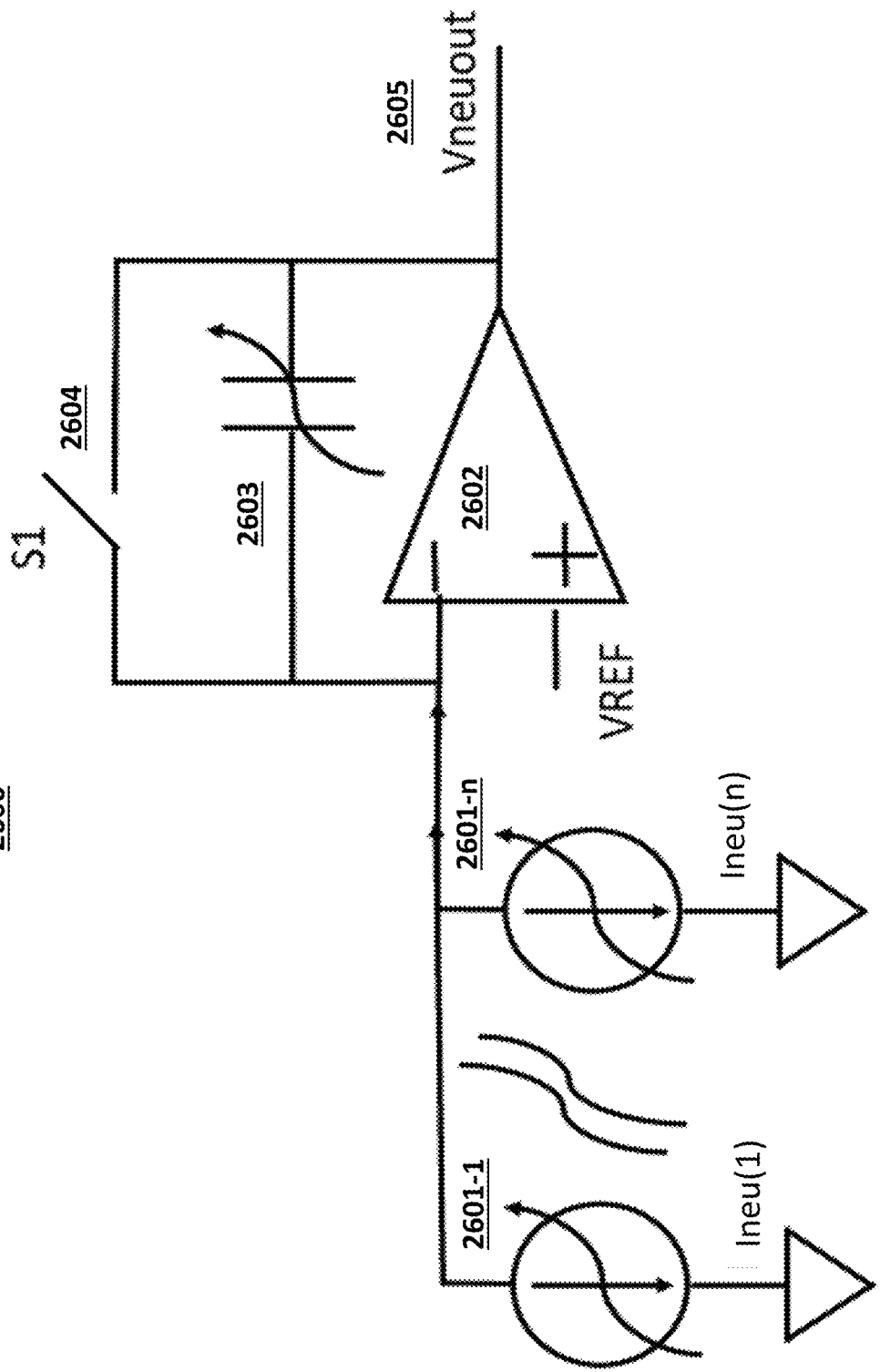
FIG. 26 depicts another embodiment of a summer circuit.

Summer circuits 2403 can include the circuits that are shown in FIGS. 25-27. It may include circuits for normalization, scaling, arithmetic operations (e.g., addition, subtraction), activation, or statistical rounding, without limitation.

FIG. 25 depicts current-to-voltage summer circuit 2500 adjustable by a variable resistor, which comprises current source 2501-1, . . . , 2501-n drawing current Ineu(1), . . . , Ineu(n), respectively (which are the currents received from bit line(s) of a VMM array), operational amplifier 2502, variable holding capacitor 2504, and variable resistor 2503. Operational amplifier 2502 outputs a voltage, Vneuout=R2503*(Ineu(1)+ . . . +Ineu(n)), which is proportional to the sum of the currents Ineu(1), . . . , Ineu(n). The holding capacitor 2504 is used to hold the output voltage when switch 2506 is open. This holding output voltage is used, for example, for conversion into digital bits by an ADC circuit.

FIG. 26 depicts current-to-voltage summer circuit 2600 adjustable by a variable capacitor (basically an integrator), which comprises current source 2601-1, . . . , 2601-n drawing current Ineu(1), . . . Ineu (n), respectively (which are the currents received from bit line(s) of a VMM array), operational amplifier 2602, variable capacitor 2603, and switch 2604. Operational amplifier 2602 outputs a voltage, Vneuout 2605=(Ineu(1)+, . . . , +Ineu(n))*integration time/C2603, which is proportional to the sum of the currents Ineu(1), . . . , Ineu(n).

Figure 27A:
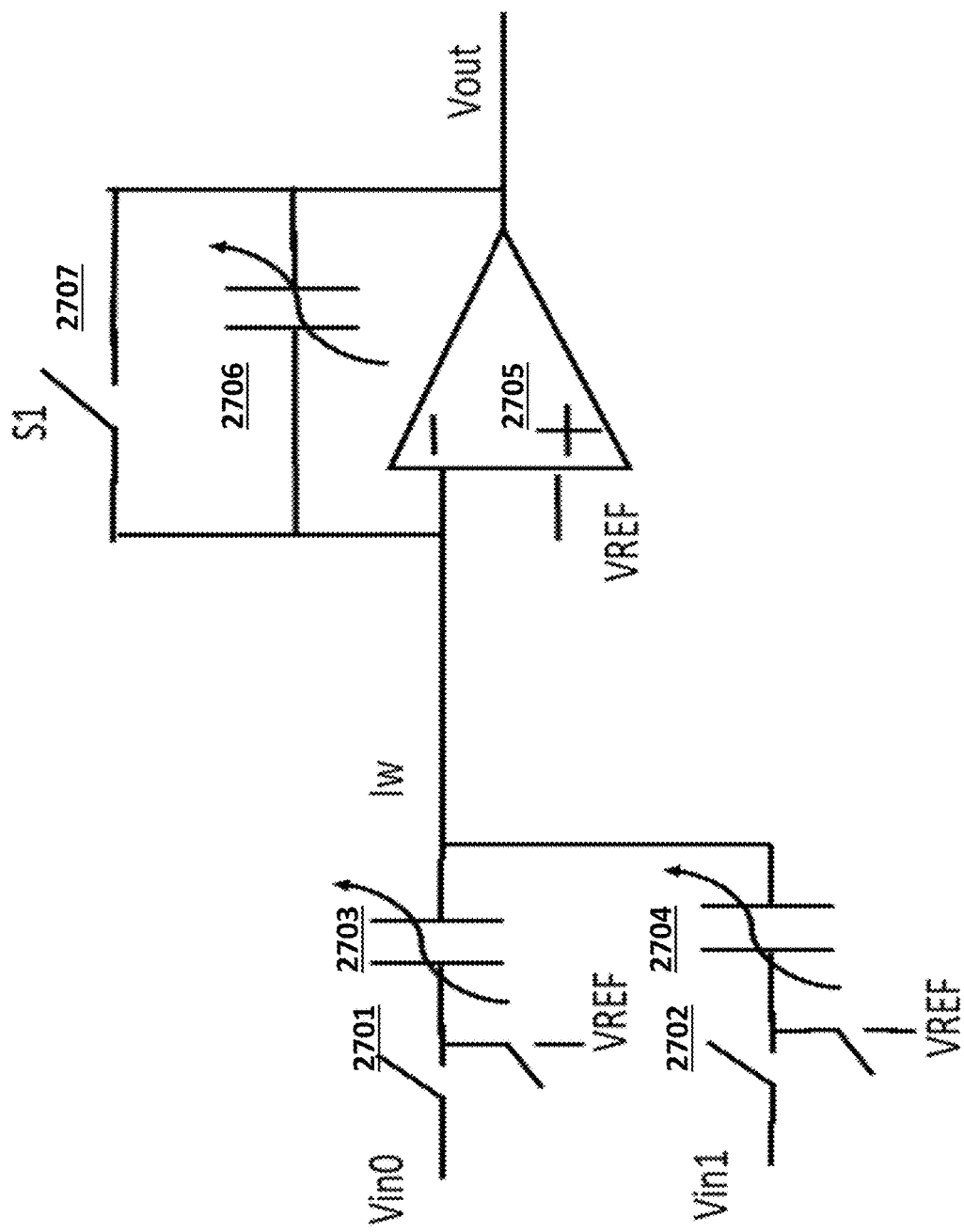
FIG. 27A depicts another embodiment of a summer circuit.

FIG. 27A depicts voltage summer 2700 adjustable by variable capacitors (i.e., a switch cap SC circuit), which comprises switches 2701 and 2702, variable capacitors 2703 and 2704, operational amplifier 2705, variable capacitor 2706, and switch S1 2707. When switch 2701 is closed, input Vin0 is provided to operational amplifier 2705. When switch 2702 is closed, input Vin1 is provided to operational amplifier 2705. Optionally, switches 2701 and 2702 are not closed at the same time. Operational amplifier 2705 generates an output Vout, that is an amplified version of the input (either Vin0 and/or Vin1, depending on which switch is closed among switches 2701 and 2702). That is Vout=Cin/Cout*(Vin), Cin is C2703 or C2704, Cout is C2706. For example Vout=Cin/Cout*Σ(Vinx), Cin=C2703=C2704, where Vinx can be either Vin0 or Vin1. In one embodiment, Vin0 is a W+ voltage and Vin1 is a W− voltage, and voltage summer 2700 adds them together (W+−W−, by enabling appropriately polarity of the switches) to generate output voltage Vout.

Figure 27B:
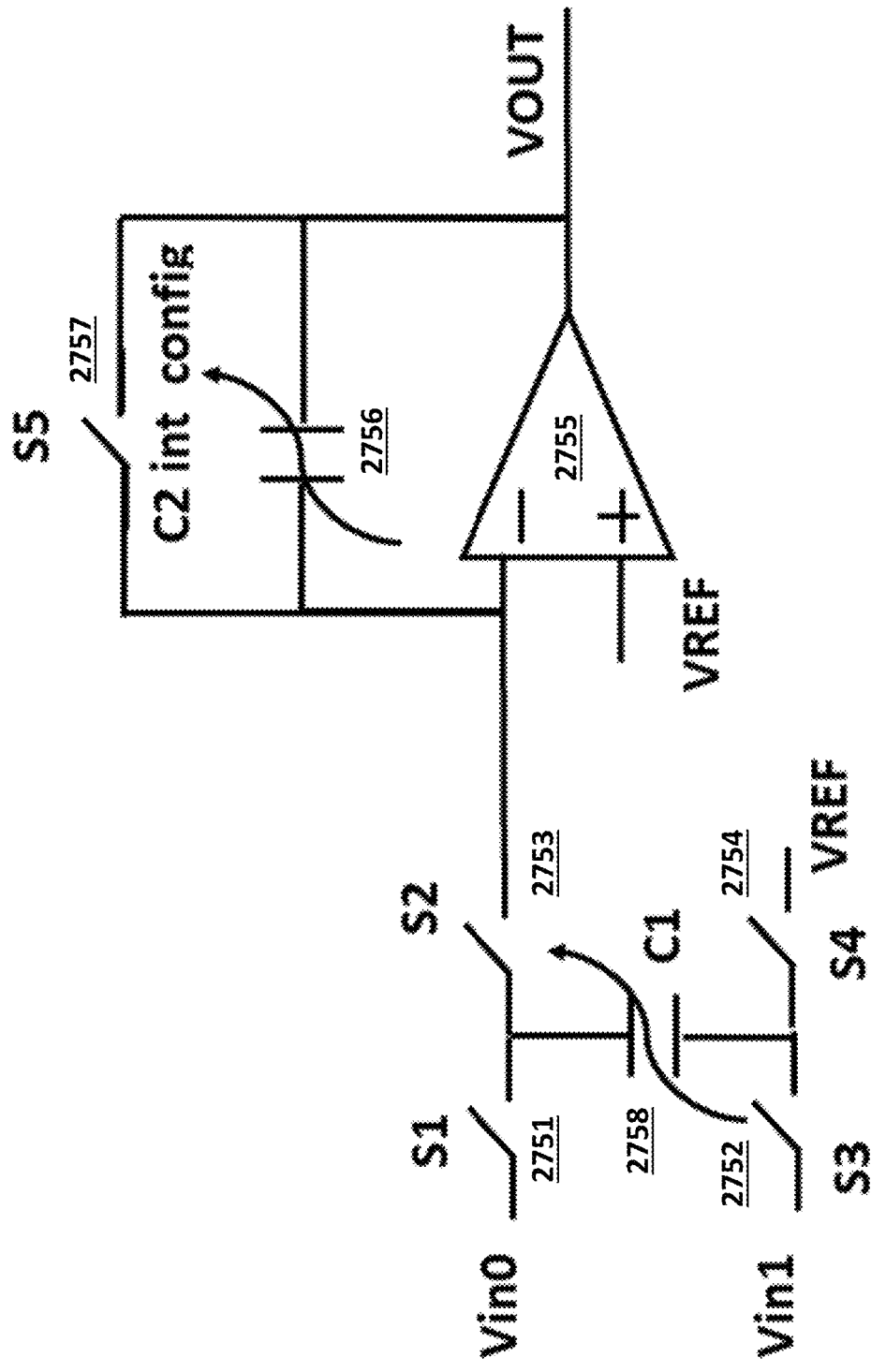
FIG. 27B depicts another embodiment of a summer circuit.

FIG. 27B depicts voltage summer 2750, which comprises switches 2751 (S1), 2752 (S3), 2753 (S2) and 2754 (S4), variable input capacitor 2758, operational amplifier 2755, variable feedback capacitor 2756, and switch 2757 (S5). In one embodiment, Vin0 is a W+ voltage and Vin1 is a W− voltage, and voltage summer 2750 adds them together to generate output voltage Vout (W+−W−, by enabling appropriately polarity of the switches).

For Input=Vin0: when switch 2754 and 2751 are closed and switches 2753, 2752 and 2757 are opened, input Vin0 is provided to top terminal of the capacitor 2758, whose bottom terminal is connected to VREF. Then switch 2751 is open and switch 2753 is closed to transfer the charge from the capacitor 2758 into the feedback capacitor 2756. Basically then the output VOUT=(C2758/C2756)*Vin0 (for case of with VREF=0 as example).

For Input=Vin1: when switches 2753, 2754, and 2757 are closed and switches 2751, 2752 and 2757 are opened, both terminals of the capacitor 2758 are discharged to VREF. Then switch 2754 is opened and switch 2752 is closed, charging the bottom terminal of the capacitor 2758 to Vin1, which in turn charges up the feedback capacitor 2756 to VOUT=−(C2758/C2756)*Vin1 (for case of VREF=0).

Hence, if the sequence described above for Vin1 input is implemented after the sequence described above for Vin0 is implemented, VOUT=(C2758/C2756)*(Vin 0−Vin1), for case of VREF=0 as example. This is used for example to realize W=W+−W−.

Each ADC as shown in FIG. 27 can be configured to combine with next ADC for higher bit implementation with appropriate design of the ADC.

With reference again to FIG. 17, inputs to and outputs from the VMM array 1701 can be in digital or analog form. For example:

Sequential Inputs IN [0:q] to DACs:
  In one embodiment, input circuit 1706 receives digital inputs in sequence, starting from IN0, then IN1, . . . , then INq.; All input bits have the same VCGin. The input bits are provided to a DAC, which then applies analog signals as inputs to VMM array 1701. All bit line (neuron) outputs are summed with an adjusting binary index multiplier, either before an ADC or after an ADC.
  In another embodiment, an adjusting neuron (bit line) binary index multiplier method is used. As shown in FIG. 20, the example summer has two bit lines BL0 and Bln. A weight is distributed across multiple bit lines BL0 to BLn. For example there are 4 bit lines BL0,BL1,BL2,BL3. The output from bitline BL0 is to be multiplied by $2^0$=1. The output from bit line BLn, which stand for nth binary bit position, is multiplied by 2^n, for example 2^3=8 for n=3. Then the output from all bit lines after being multiplied appropriately by binary bit position 2^n, are summed together. Then this is digitized by the ADC. This method means all cells have only a binary range, the multi level range (n-bit) is accomplished by the peripheral circuit (meaning by the summer circuit). Hence the voltage drop for all the bit lines is approximately the same for highest bias level of memory cell.

In another embodiment, digital inputs IN0, IN1, . . . , then INq are applied in sequential fashion. Each input bit has a corresponding analog value VCGin. All neuron outputs are summed for all input bit evaluations, either before ADC or after ADC.

Parallel Inputs to DACs:

In another embodiment, inputs IN0, . . . INq are provided in parallel fashion to DACs. Each input IN[0:q] has a corresponding analog value VCGin. All neuron outputs are summed with adjusting binary index multiplier method, either before an ADC or after an ADC.

In the embodiments that involve sequential operation of the arrays, power is more evenly distributed.

In the embodiments that utilize the neuron (bit line) binary index method, power consumption is reduced in in the array since each cell coupled to the bit line only contains binary levels, the 2^n level is accomplished by the summer circuit.

Figure 28C:
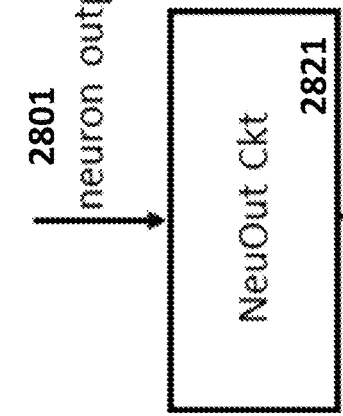
FIG. 28C depicts another embodiment of an output circuit.
Figure 28B:
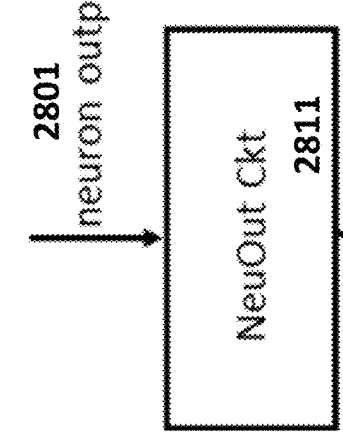
FIG. 28B depicts another embodiment of an output circuit.
Figure 28A:
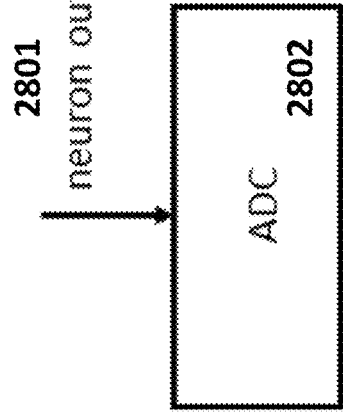
FIG. 28A depicts an embodiment of an output circuit.

FIGS. 28A, 28B, and 28C depict output circuits that can be used for summer circuits 2403 and analog-to-digital converters 2404 in FIG. 24.

FIG. 28A depicts output circuit 2800, which comprises analog-to-digital converter 2802, which receives neuron output 2801 and outputs output digital bits 2803.

FIG. 28B depicts output circuit 2810, which comprises neuron output circuit 2811 and analog-to-digital converter 2812, which together receive neuron output 2801 and generates outputs 2813.

FIG. 28C depicts output circuit 2820, which comprises neuron output circuit 2821 and converter 2822, which together receive neuron output 2801 and generates outputs 2823.

Neuron output circuit 2811 or 2821 can, for example, perform summing, scaling, normalization, or arithmetic operations, without limitation. Converter 2822, for example, can perform ADC, PDC, AAC, or APC operation, without limitation.

Figure 29:
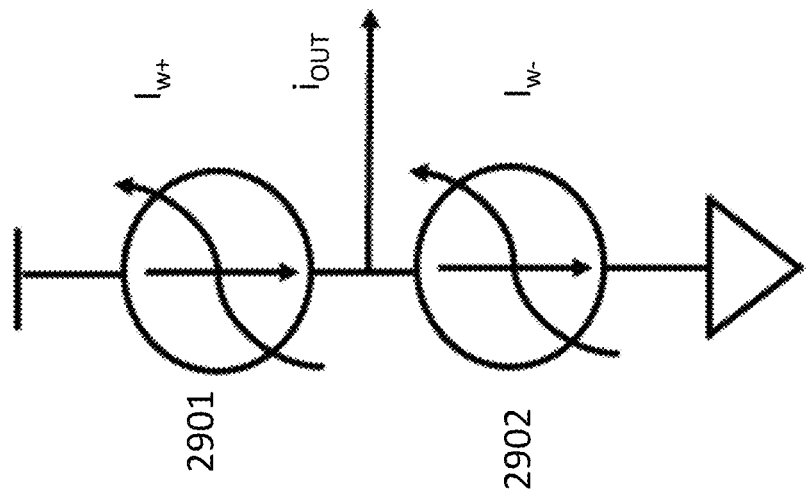
FIG. 29 depicts a neuron output circuit.

FIG. 29 depicts neuron output circuit 2900, which comprises adjustable (scaling) current source 2901 and adjustable (scaling) current source 2902, which together generate output $i_{OUT}$, which is the neuron output. This circuit can perform a summation of a positive weight, W+, and a negative weight, W−, i.e., W=W+−W−, and up or down scaling of the output neuron current (through adjustment of the adjustable current sources 2901 and 2902) at the same time. That is, $I_{W+}$ is a scaled version of W+, and $I_{W-}$ is a scaled version of W−.

Figure 30:
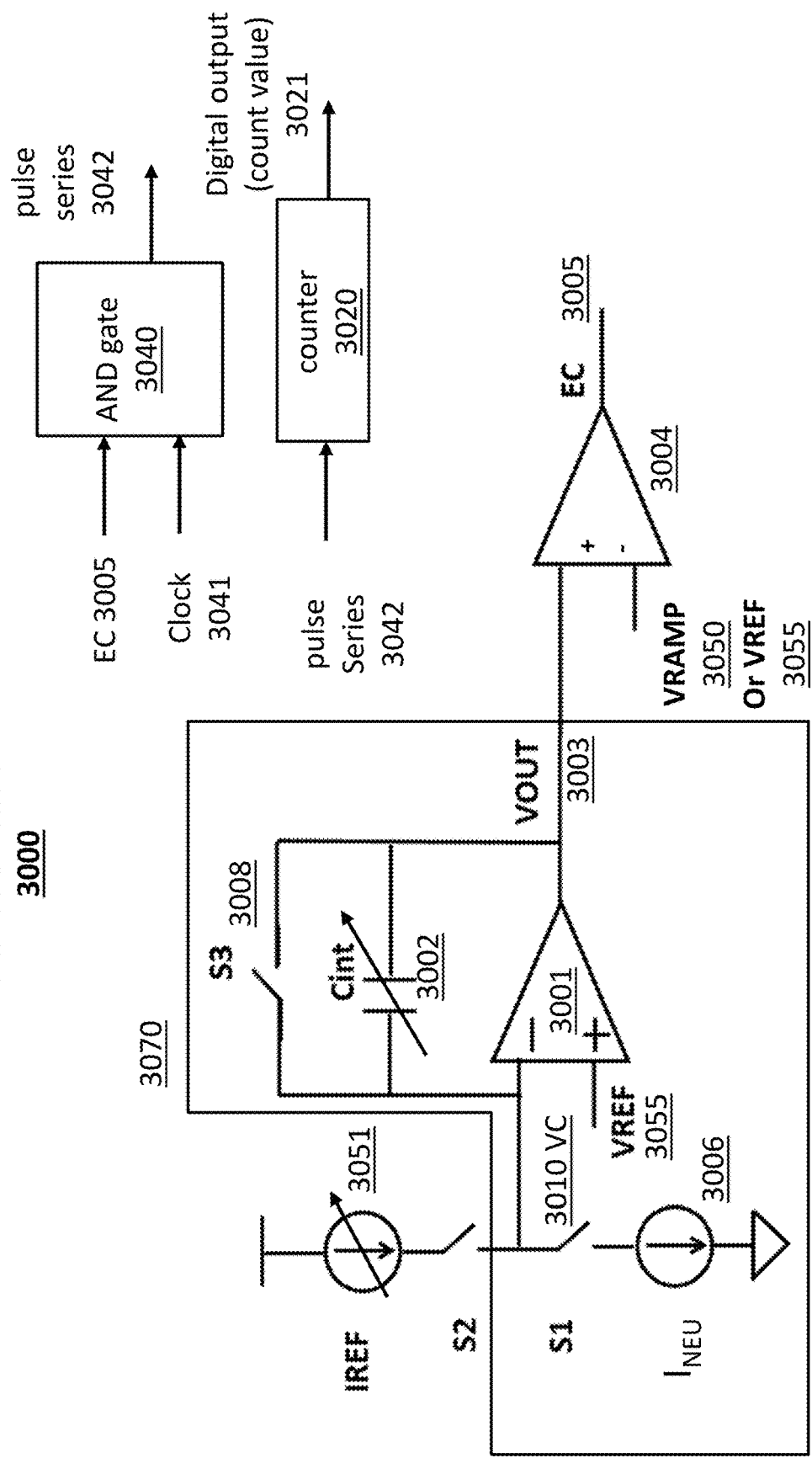
FIG. 30 depicts an embodiment of an analog-to-digital converter.

FIG. 30 depicts configurable serial analog-to-digital converter 3000. It includes integrator 3070 which integrates the neuron output current into the integrating capacitor 3002 (Cint).

In one embodiment, VRAMP 3050 is provided to the inverting input of comparator 3004. The digital output (count value) 3021 is produced by ramping VRAMP 3050 until the comparator 3004 switches polarity, with counter 3020 counting clock pulses from the beginning of the ramp.

In another embodiment, VREF 3055 is provided to the inverting input of comparator 3004. VC 3010 is ramped down by ramp current 3051 (IREF) until VOUT 3003 reaches VREF 3055, at which point the EC 3005 signal disables the count of counter 3020. The (n-bit) ADC 3000 is configurable to have a lower precision (fewer than n bits) or a higher precision (more than n bits), depending on the target application. The configurability of precision is done by configuring the capacitance of capacitor 3002, the current 3051 (IREF), the ramping rate of VRAMP 3050, or the clocking frequency of clock 3041, without limitation.

In another embodiment, the ADC circuit of a VMM array is configured to have a precision lower than n bits and the ADC circuits of another VMM array is configured to have high a precision greater than bits.

In another embodiment, one instance of serial ADC circuit 3000 of one neuron circuit is configured to combine with another instance of serial ADC circuit 3000 of the next neuron circuit to produce an ADC circuit with higher than n-bit precision, such as by combining the integrating capacitor 3002 of the two instances of serial ADC circuits 3000.

Figure 31:
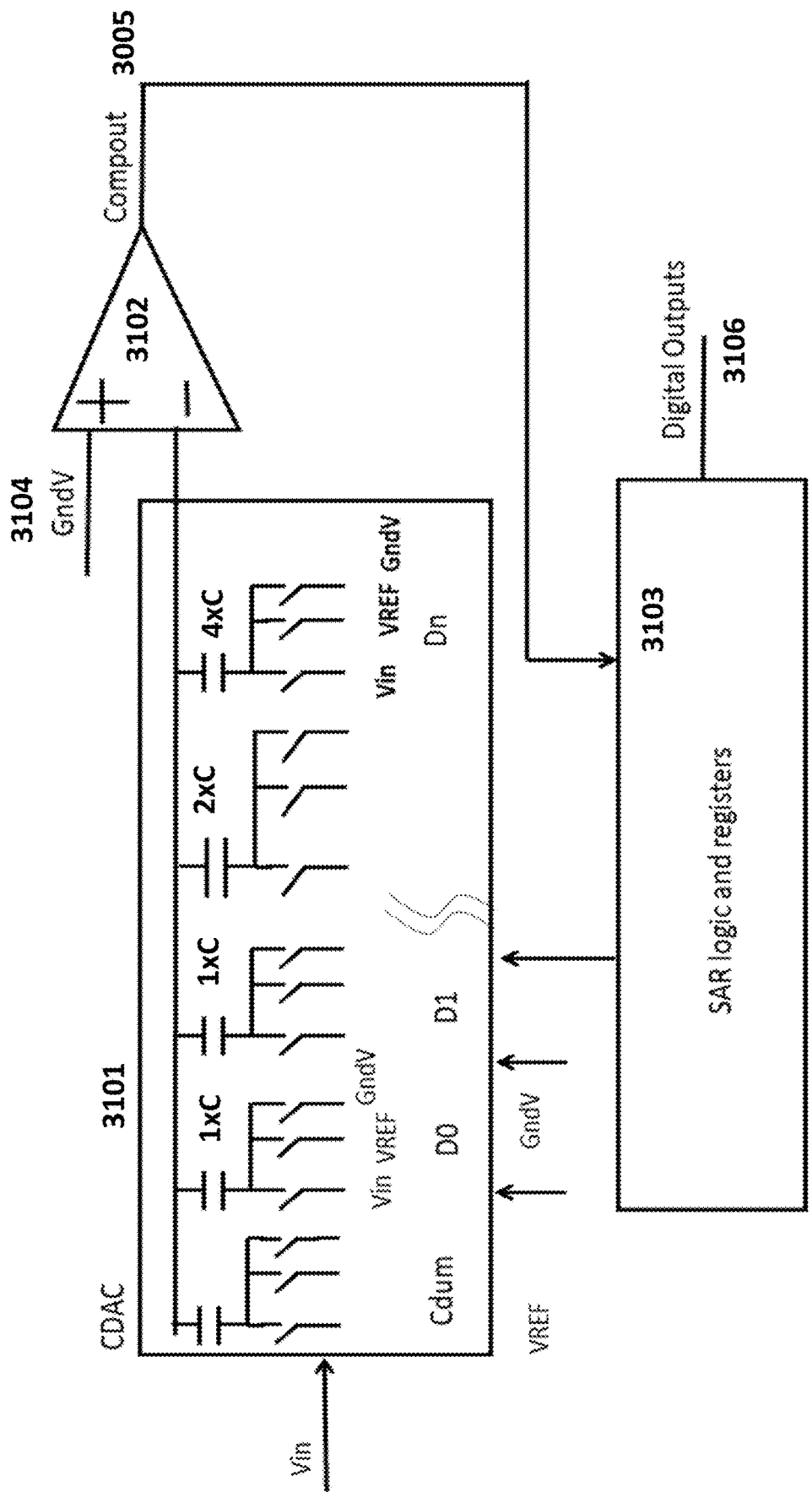
FIG. 31 depicts another embodiment of an analog-to-digital converter.

FIG. 31 depicts a configurable neuron SAR (successive approximation register) analog-to-digital converter 3100. This circuit is a successive approximation converter that bases on charge redistribution using binary capacitors. It includes a binary CDAC (DAC basing on capacitors) 3101, op-amp/comparator 3102, and SAR logic and register 3103. As shown GndV 3104 is a low voltage reference level, for example ground level. SAR logic and register 3103 provides digital outputs 3106.

Figure 32:
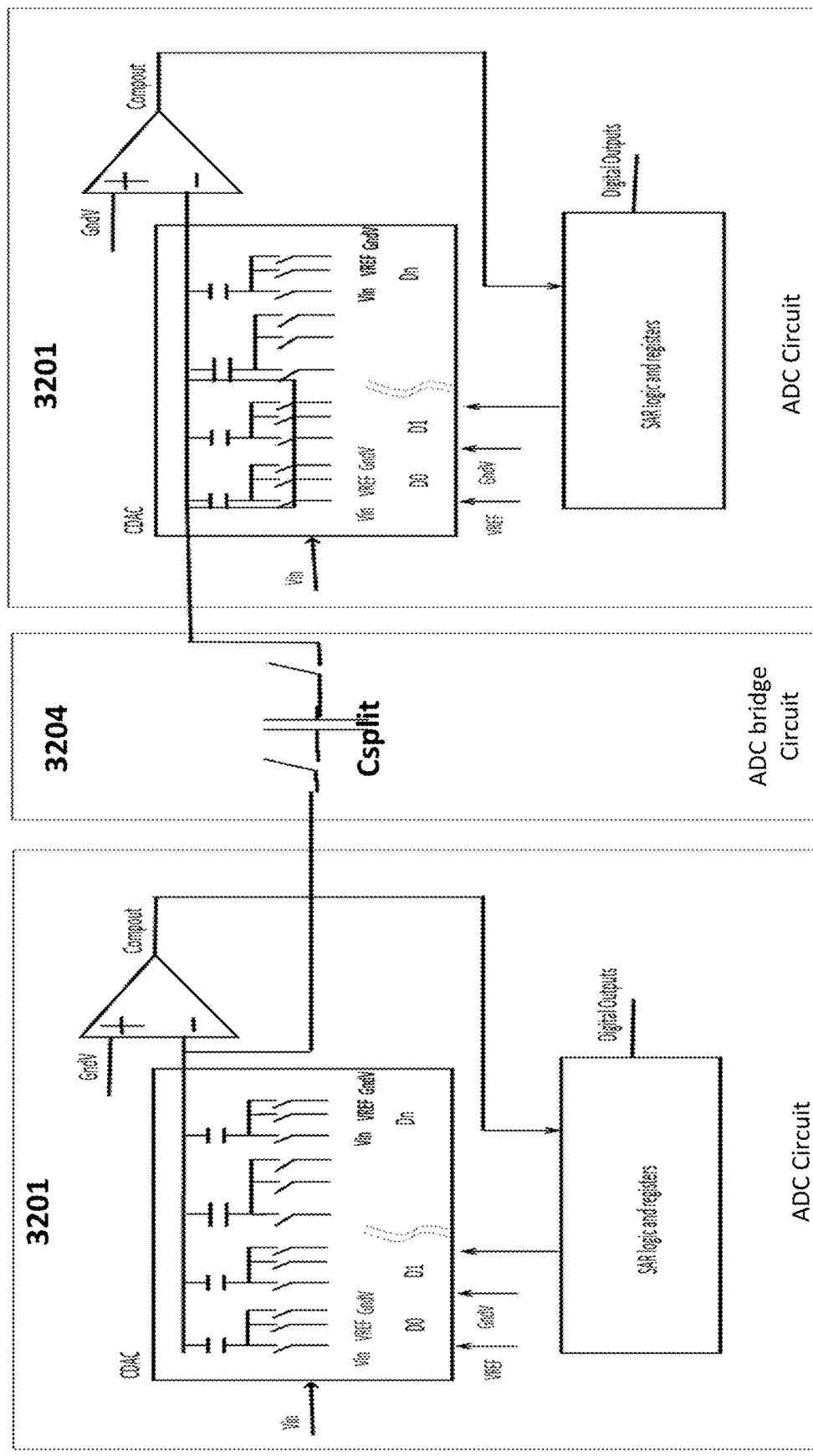
FIG. 32 depicts another embodiment of an analog-to-digital converter.

FIG. 32 depicts a configurable neuron combo SAR analog-to-digital converter circuit 3200. This circuit combines two n-bit ADCs from two neuron circuits into one to achieve higher precision than n-bits, for example for a 4-bit ADC for one neuron circuit, this circuit can achieve >4-bit precision such as 8-bit ADC precision by combining two 4-bit ADCs. The combo circuit topology is equivalent to a split cap (bridge-capacitor (cap) or attention cap) SAR ADC circuit, for example a 8-bit 4C-4C SAR ADC resulted by combining two adjacent 4-bit 4C SAR ADC circuits. A bridge circuit 3204 (Csplit) is used to accomplish this, the capacitance of this circuit is =(total number of CDAC cap unit/total number of CDAC cap unit −1).

Figure 33:
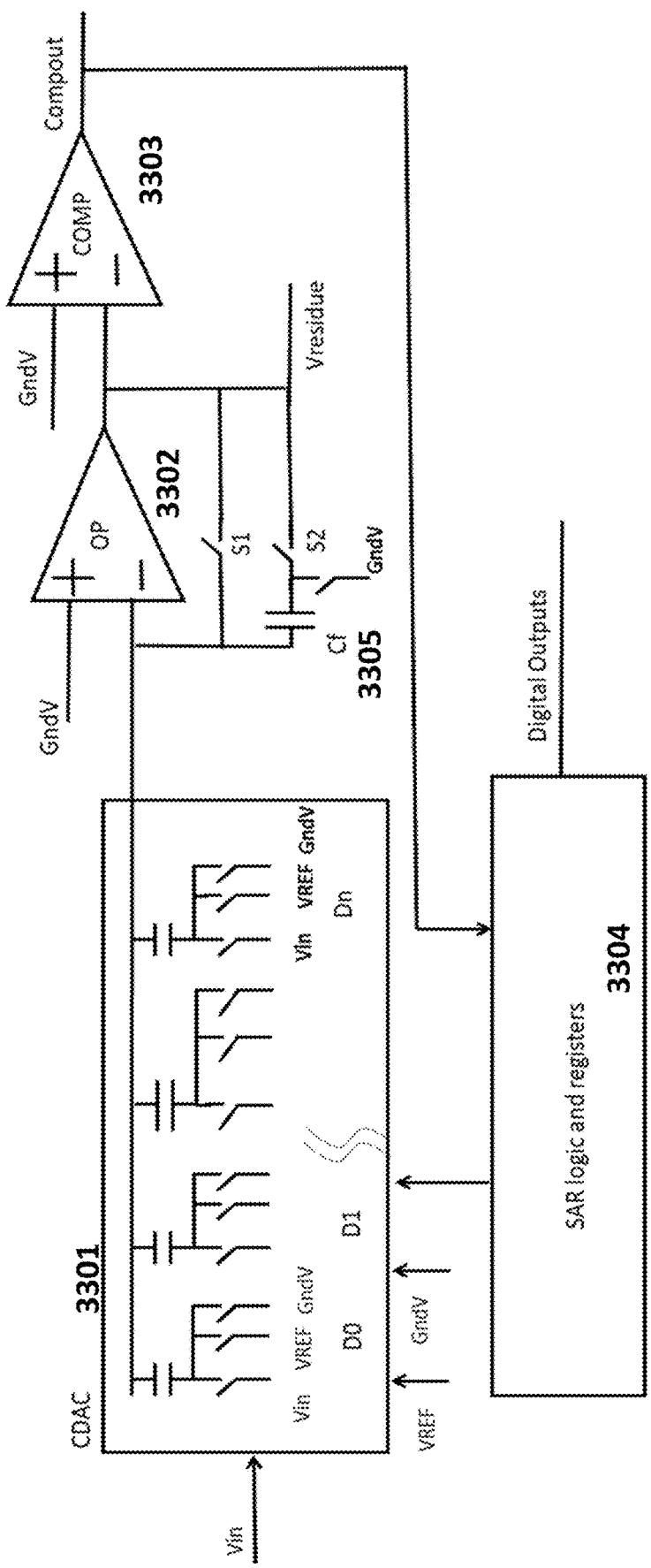
FIG. 33 depicts another embodiment of an analog-to-digital converter

FIG. 33 depicts a pipelined SAR ADC circuit 3300 that can be used to combine with the next SAR ADC to increase the number of bits in a pipelined fashion. SAR ADC circuit 3300 comprises binary CDAC (DAC basing on capacitors) 3301, op-amp/comparator 3302, op-amp/comparator 3303, SAR logic and register 3304. As shown GndV 3104 is a low voltage reference level, for example ground level. SAR logic and register 3103 provides digital outputs 3106. Vin is in the input voltage, VREF is a reference voltage, and GndV is a ground voltage. Vresidue is generated by capacitor 3305 and is provided as an input to the next stage of an SAR ADC.

Additional implementation details regarding configurable output neurons (such as configurable neuron ADC) circuits can be found in U.S. patent application Ser. No. 16/449,201, filed on Jun. 21, 2019 by the same assignee, and titled "Configurable Input Blocks and Output Blocks and Physical Layout for Analog Neural Memory in a Deep Learning Artificial Neural Network," which is incorporated by reference herein.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A system comprising:
   a first array of non-volatile memory cells, wherein the cells are arranged in rows and columns and the non-volatile memory cells in one or more of the columns stores W+ values, and wherein one of the columns in the first array is a dummy column; and
   a second array of non-volatile memory cells, wherein the cells are arranged in rows and columns and the non-volatile memory cells in one or more of the columns stores W− values, and wherein one of the columns in the second array is a dummy column;
   wherein pairs of cells from the first array and the second array store a differential weight, W, according to the formula W=(W+)−(W−).

2. The system of claim 1, further comprising source line pulldown bit lines.

3. The system of claim 1, further comprising redundant columns.

4. The system of claim 3, wherein the redundant columns are used to remap weights from a W+ or W− column.

5. The system of claim 4, wherein the redundant columns are used to remap weights to avoid floating gate to floating gate coupling.

6. The system of claim 4, wherein the redundant columns are used to remap weights to distribute power more evenly among the columns.

7. The system of claim 4, wherein the redundant columns are used to remap weight from noisy or defective cells.

8. The system of claim 1, wherein the non-volatile memory cells in the first array and the second array are split gate flash memory cells.

9. The system of claim 1, wherein the non-volatile memory cells in the first array and the second array are stacked gate flash memory cells.

10. The system of claim 1, further comprising a summer for summing outputs from one or more bit lines.

11. The system of claim 10, wherein the summer is adjustable based on a variable resistor.

12. The system of claim 10, wherein the summer is adjustable based on a variable capacitor.

13. The system of claim 10, wherein the summer comprises a switched capacitor circuit and an operational amplifier.

14. The system of claim 10, further comprising an analog-to-digital converter for converting an output of the summer into a digital signal.

15. The system of claim 14, wherein the analog-to-digital converter comprises a successive approximation register.

16. The system of claim 14, wherein the analog-to-digital converter is a pipelined analog-to-digital converter.

* * * * *